(12) United States Patent
Derkacs

(10) Patent No.: US 10,896,982 B2
(45) Date of Patent: Jan. 19, 2021

(54) METHOD OF FORMING A MULTIJUNCTION METAMORPHIC SOLAR CELL ASSEMBLY FOR SPACE APPLICATIONS

(71) Applicant: SolAero Technologies Corp., Albuquerque, NM (US)

(72) Inventor: Daniel Derkacs, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 16/803,519

(22) Filed: Feb. 27, 2020

(65) Prior Publication Data
US 2020/0203537 A1    Jun. 25, 2020

Related U.S. Application Data

(62) Division of application No. 15/980,983, filed on May 16, 2018, now Pat. No. 10,714,636, which is a
(Continued)

(51) Int. Cl.
*H01L 31/02* (2006.01)
*H01L 31/078* (2012.01)
(Continued)

(52) U.S. Cl.
CPC ............ *H01L 31/02008* (2013.01); *H01L 31/022425* (2013.01); *H01L 31/0504* (2013.01); *H01L 31/0547* (2014.12); *H01L 31/0693* (2013.01); *H01L 31/06875* (2013.01); *H01L 31/078* (2013.01); *H01L 31/0725* (2013.01); *H01L 31/0735* (2013.01); *H01L 31/1844* (2013.01); *H01L 31/1852* (2013.01); *Y02E 10/52* (2013.01); *Y02E 10/544* (2013.01)

(58) Field of Classification Search
CPC ........... H01L 31/03046; H01L 31/0693; H01L 31/06875; H01L 31/06; H01L 31/184; H01L 31/1844; H01L 31/03529; H01L 31/0735
See application file for complete search history.

(56) References Cited

U.S. PATENT DOCUMENTS 5,322,572 A * 6/1994 Wanlass .............. H01L 31/0475
136/249
6,239,354 B1 * 5/2001 Wanlass ................ H01L 27/142
136/244
(Continued)

*Primary Examiner* — Golam Mowla

(57) ABSTRACT

A multijunction solar cell assembly and its method of manufacture including interconnected first and second discrete semiconductor body subassemblies disposed adjacent and parallel to each other, each semiconductor body subassembly including first top subcell, second (and possibly third) lattice matched middle subcells; a graded interlayer adjacent to the last middle solar subcell; and a bottom solar subcell adjacent to said graded interlayer being lattice mismatched with respect to the last middle solar subcell; wherein the interconnected subassemblies form at least a four junction solar cell by a series connection being formed between the bottom solar subcell in the first semiconductor body and the bottom solar subcell in the second semiconductor body.

19 Claims, 7 Drawing Sheets

Related U.S. Application Data division of application No. 15/249,204, filed on Aug. 26, 2016, now Pat. No. 9,935,209.

(60) Provisional application No. 62/288,181, filed on Jan. 28, 2016.

(51) Int. Cl.

| | |
|---|---|
| *H01L 31/0693* | (2012.01) |
| *H01L 31/0224* | (2006.01) |
| *H01L 31/0687* | (2012.01) |
| *H01L 31/054* | (2014.01) |
| *H01L 31/05* | (2014.01) |
| *H01L 31/0725* | (2012.01) |
| *H01L 31/0735* | (2012.01) |
| *H01L 31/18* | (2006.01) |

(56) References Cited

U.S. PATENT DOCUMENTS

| | | | | |
|---|---|---|---|---|
| 6,680,432 B2 * | 1/2004 | Sharps | ............... | H01L 31/0735 136/255 |
| 7,741,146 B2 * | 6/2010 | Cornfeld | ............ | H01L 31/0725 438/87 |
| 8,586,859 B2 * | 11/2013 | Varghese | ............ | H01L 31/1892 136/249 |
| 2006/0144435 A1 * | 7/2006 | Wanlass | ............. | H01L 31/0687 136/249 |
| 2007/0079863 A1 * | 4/2007 | Stan | ................ | H01L 31/022425 136/244 |
| 2008/0149173 A1 * | 6/2008 | Sharps | ............... | H01L 31/0443 136/255 |
| 2008/0185038 A1 * | 8/2008 | Sharps | ............ | H01L 31/06875 136/255 |
| 2009/0155951 A1 * | 6/2009 | Stan | .................... | H01L 31/0693 438/74 |
| 2009/0155952 A1 * | 6/2009 | Stan | ................. | H01L 31/03046 438/94 |
| 2010/0229913 A1 * | 9/2010 | Cornfeld | ............ | H01L 31/0725 136/244 |
| 2010/0233839 A1 * | 9/2010 | Cornfeld | ........... | H01L 31/03042 438/66 |
| 2012/0186641 A1 * | 7/2012 | Sharps | ............... | H01L 31/0735 136/255 |
| 2013/0014803 A1 * | 1/2013 | Varghese | ............ | H01L 31/1892 136/244 |

\* cited by examiner

METHOD OF FORMING A MULTIJUNCTION METAMORPHIC SOLAR CELL ASSEMBLY FOR SPACE APPLICATIONS

REFERENCE TO RELATED APPLICATIONS

This application is a divisional of U.S. patent application Ser. No. 15/980,983 filed May 16, 2018, which was a divisional of U.S. patent application Ser. No. 15/249,204 filed Aug. 26, 2016, now U.S. Pat. No. 9,935,209, which claims the benefit of U.S. Provisional Application No. 62/288,181 filed Jan. 28, 2016.

The present application is related to U.S. patent application Ser. No. 15/249,185 filed Aug. 26, 2016.

The present application is also related to U.S. Provisional Patent Application Ser. No. 62/243,239 filed Oct. 19, 2015.

This application is also related to U.S. patent application Ser. No. 14/660,092 filed Mar. 17, 2015, which is a division of U.S. patent application Ser. No. 12/716,814 filed Mar. 3, 2010, now U.S. Pat. No. 9,018,521, which was a continuation in part of U.S. patent application Ser. No. 12/337,043 filed Dec. 17, 2008.

This application is also related to co-pending U.S. patent application Ser. No. 13/872,663 filed Apr. 29, 2012, which was also a continuation-in-part of application Ser. No. 12/337,043, filed Dec. 17, 2008.

This application is also related to co-pending U.S. patent application Ser. Nos. 14/828,197 and 14/828,206 filed Aug. 17, 2015.

All of the above related applications are incorporated herein by reference in their entirety.

BACKGROUND OF THE INVENTION

Field of the Invention

The present disclosure relates to solar cells and the fabrication of solar cells, and more particularly the design and specification of a multijunction solar cell using electrically coupled but spatially separated semiconductor bodies based on III-V semiconductor compounds.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, Ill-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 27% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, and applications anticipated for five, ten, twenty or more years, the power-to-weight ratio and lifetime efficiency of a solar cell becomes increasingly more important, and there is increasing interest not only the amount of power provided at initial deployment, but over the entire service life of the satellite system, or in terms of a design specification, the amount of power provided at a specific future time, often referred to as the "end of life" (EOL).

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The individual solar cells or wafers are then disposed in horizontal arrays or panels, with the individual solar cells connected together in an electrical series and/or parallel circuit. The shape and structure of an array, as well as the number of cells it contains, are determined in part by the desired output voltage and current.

The efficiency of energy conversion, which converts solar energy (or photons) to electrical energy, depends on various factors such as the design of solar cell structures, the choice of semiconductor materials, and the thickness of each subcell. In short, the energy conversion efficiency for each solar cell is dependent on the optimum utilization of the available sunlight across the solar spectrum as well as the "age" of the solar cell, i.e. the length of time it has been deployed and subject to degradation associated with the temperature and radiation in the deployed space environment. As such, the characteristic of sunlight absorption in semiconductor material, also known as photovoltaic properties, is critical to determine the most efficient semiconductor to achieve the optimum energy conversion to meet customer requirements of intended orbit and lifetime.

The energy conversion efficiency of multijunction solar cells is affected by such factors as the number of subcells, the thickness of each subcell, the composition and doping of each active layer in a subcell, and the consequential band structure, electron energy levels, conduction, and absorption of each subcell, as well as its exposure to radiation in the ambient environment over time. The designation and specification of such parameters is a non-trivial engineering undertaking, and would vary depending upon the specific space mission and customer design requirements. Such design variables are interdependent and interact in complex and often unpredictable ways. In the terminology of some, such parameters are NOT simple "result effective" variables to those skilled in the art confronted with complex design specifications and practical operational considerations.

As a result of the selection of such design variables, electrical properties such as the short circuit current density ($J_{sc}$), the open circuit voltage ($V_{oc}$), and the fill factor, which determine the efficiency and power output of the solar cell, are thereby affected by the slightest change in such design variables, and as noted above, to further complicate the calculus, such variables and resulting properties also vary over time (i.e. during the operational life of the system).

One electrical parameter of consideration taught by the present disclosure is the difference between the band gap and the open circuit voltage, or ($E_g/q-V_{oc}$), of a particular active layer. Again, the value of such parameter may vary depending on subcell layer thicknesses, doping, the composition of adjacent layers (such as tunnel diodes), and even the specific wafer being examined from a set of wafers processed on a single supporting platter in a reactor run. One of the important mechanical or structural considerations in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters. The present application is directed to solar cells with several substantially lattice matched subcells, but including at least one subcell which is lattice mismatched, and in a particular embodiment to a five junction (5J) solar cell using electrically coupled but spatially separated four junction (4J) semiconductor bodies based on III-V semiconductor compounds.

SUMMARY OF THE DISCLOSURE

Objects of the Disclosure

It is an object of the present disclosure to provide increased photoconversion efficiency in a multijunction solar cell for space applications over the operational life of the photovoltaic power system.

It is another object of the present disclosure to provide in a multijunction solar cell in which the selection of the composition of the subcells and their band gaps maximizes the efficiency of the solar cell at a predetermined high temperature (in the range of 40 to 100 degrees Centigrade) in deployment in space at AM0 at a predetermined time after the initial deployment, such time being at least one year, and in the range of one to twenty-five years.

It is another object of the present disclosure to provide a four junction solar cell subassembly in which the average band gap of all four cells in the subassembly is greater than 1.44 eV, and to couple the subassembly in electrical series with at least one additional subcell in an adjacent solar cell subassembly.

It is another object of the present disclosure to provide a lattice mis-matched five junction solar cell in which the bottom subcell is intentionally designed to have a short circuit current that is substantially greater than current through the top three subcells when measured at the "beginning-of-life" or time of initial deployment.

It is another object of the present disclosure to provide a five-junction (5J) solar assembly assembled from two four-junction (4J) solar cell subassemblies so that the total current provided by the two subassemblies matches the total current handling capability of the bottom subcell of the assembly.

It is another object of the present disclosure to match the larger short circuit current of the bottom subcell of the solar cell assembly with two or three parallel stacks of solar subcells, i.e. a configuration in which the value of the short circuit current of the bottom subcell is at least twice, or at least three times, that of the solar subcells in each parallel stack which are connected in a series with the bottom subcell. Stated another way, given the choice of the composition of the bottom subcell, and there by the short circuit current of the bottom subcell, it is an object of the disclosure that the upper subcell stack be specified and designed to have a short circuit which is one-half or less than that of the bottom subcell.

Some implementations of the present disclosure may incorporate or implement fewer of the aspects and features noted in the foregoing objects.

Features of the Invention

Briefly, and in general terms, the present disclosure describes solar cells that include a solar cell assembly of two or more solar cell subassemblies, each of which includes a respective monolithic semiconductor body composed of a tandem stack of solar subcells, where the subassemblies are interconnected electrically to one another.

As described in greater detail, the inventors of the present application have discovered that interconnecting two or more spatially split multijunction solar cell subassemblies can be advantageous. The spatial split can be provided for multiple solar cell subassemblies monolithically formed on a single substrate and remaining as a monolithic semiconductor body with distinct characteristics. Alternatively, the solar cell subassemblies can be physically separated or fabricated individually as separate semiconductor chips that can be coupled together electrically. (Such alternative embodiments are covered in parallel applications noted in the Reference to Related Applications).

One advantage of interconnecting two or more spatially split multijunction solar cell subassemblies is that such an arrangement can allow accumulation of the current from the upper subcells in the adjacent semiconductor bodies into the bottom subcells which have higher current generation ability.

One advantage of interconnecting two or more spatially split multijunction solar cell subassemblies is that such an arrangement can allow the bottom subcells of different subassemblies to be connected in electrical series, this boosting the maximum operational voltage and open circuit voltage associated with the solar cell assembly, and thereby improving efficiency.

Further, selection of relatively high band gap semiconductor materials for the top subcells can provide for increased photoconversion efficiency in a multijunction solar cell for outer space or other applications over the operational life of the photovoltaic power system. For example, increased photoconversion efficiency at a predetermined time (measured in terms of five, ten, fifteen or more years) after initial deployment of the solar cell can be achieved.

Thus, in one aspect, a monolithic solar cell subassembly includes a first semiconductor body including an upper first solar subcell composed of (aluminum) indium gallium phosphide ((Al)InGaP); a second solar subcell disposed adjacent to and lattice matched to said upper first subcell, the second solar subcell composed of (aluminum) (indium) gallium arsenide ((Al)(In)GaAs) or indium gallium arsenide phosphide (InGaAsP); and a bottom subcell lattice matched to said second subcell and composed of (indium) gallium arsenide (In)GaAs.

The aluminum (or Al) constituent element, or indium (or In), shown in parenthesis in the preceding formula means that Al or In (as the case may be) is an optional constituent, and in the case of Al, in this instance may be used in an amount ranging from 0% to 40% by mole fraction. In some embodiments, the amount of aluminum may be between 20% and 30%. The subcells are configured so that the current density of the upper first subcell and the second subcell have a substantially equal predetermined first value, and the current density of the bottom subcell is at least twice that of the predetermined first value.

Briefly, and in general terms, the present disclosure provides a five junction solar cell comprising:

(a) a first semiconductor body including:
an upper first solar subcell composed of a semiconductor material having a first band gap, and including a top contact on the top surface thereof;
a second solar subcell adjacent to said first solar subcell and composed of a semiconductor material having a second band gap smaller than the first band gap and being lattice matched with the upper first solar subcell;
a third solar subcell adjacent to said second solar subcell and composed of a semiconductor material having a third band gap smaller than the second band gap and being lattice matched with the second solar subcell;
an interlayer adjacent to said third solar subcell, said interlayer having a fourth band gap or band gaps greater than said third band gap; and
a fourth solar subcell adjacent to said interlayer and composed of a semiconductor material having a fifth band gap smaller than the fourth band gap and being lattice mismatched with the third solar subcell, and including a first contact on the top surface thereof, and a second contact on the bottom surface thereof;

(b) a second semiconductor body disposed adjacent and parallel to the first semiconductor body and including:
an upper first solar subcell composed of a semiconductor material having a first band gap, and including a top contact on the top surface thereof;
a second solar subcell adjacent to said first solar subcell and composed of a semiconductor material having a second band gap smaller than the first band gap and being lattice matched with the upper first solar subcell;
a third solar subcell adjacent to said second solar subcell and composed of a semiconductor material having a third band gap smaller than the second band gap and being lattice matched with the second solar subcell and having a bottom contact;
an interlayer adjacent to said third solar subcell, said interlayer having a fourth band gap greater than said third band gap; and
a fourth solar subcell adjacent to said interlayer and composed of a semiconductor material having a fifth band gap smaller than the fourth band gap and being lattice mismatched with the third solar subcell, and including a first contact on the top surface thereof, and a second contact on the bottom surface thereof connected to the terminal of a second polarity;

(c) wherein the top contact of the first semiconductor body is electrically coupled with the top contact of the second semiconductor body and to a terminal of first polarity;
wherein the first contact on the top surface of the fourth solar subcell of the first semiconductor body is electrically coupled with the bottom contact of the third solar subcell of the second semiconductor body; and
the second contact on the bottom surface of the fourth solar subcell of the first semiconductor body is electrically coupled with the first contact on the top surface of the fourth solar subcell of the second semiconductor body thereof so as to form a five junction solar cell.

In some embodiments, the interlayer in each of the first and second semiconductor bodies is compositionally graded to substantially lattice match the upper solar subcell on one side and the adjacent lower solar subcell on the other side, and is composed of any of the As, P, N, Sb based III-V compound semiconductors subject to the constraints of having the in-plane lattice parameter less than or equal to that of the third solar subcell on the first surface and greater than or equal to that of the lower fourth solar subcell on the other opposing surface.

In some embodiments, the interlayer in each of the first and second semiconductor bodies is compositionally graded to substantially lattice match the upper solar subcell on one side and the adjacent lower fourth subcell on the other side, and is composed of any of the As, P, N, Sb based III-V compound semiconductors subject to the constraints of having the in-plane lattice parameter less than or approximately equal to that of the third solar subcell on the first surface and greater than or approximately equal to that of the lower fourth solar subcell on the opposing surface.

In some embodiments, the interlayer in each of the first and second semiconductor bodies is compositionally graded to substantially lattice match the third solar subcell on one side and the lower fourth solar subcell on the other side, and is composed of $(In_xGa_{1-x})Al_{1-y}As_y$, $In_xGa_{1-x}P$, or $(Al)In_xGa_{1-x}As$ compound semiconductors subject to the constraints of having the in-plane lattice parameter less than or equal to that of the third solar subcell and greater than or equal to that of the lower fourth solar subcell.

In some embodiments, the fourth subcell has a band gap of approximately 0.67 eV, the third subcell has a band gap in the range of 1.41 eV and 1.31 eV, the second subcell has a band gap in the range of 1.65 to 1.8 eV and the upper first subcell has a band gap in the range of 2.0 to 2.20 eV.

In some embodiments, the third subcell has a band gap of approximately 1.37 eV, the second subcell has a band gap of approximately 1.73 eV and the upper first subcell has a band gap of approximately 2.10 eV.

In some embodiments, the upper first subcell is composed of indium gallium aluminum phosphide; the second solar subcell includes an emitter layer composed of indium gallium phosphide or aluminum gallium arsenide, and a base layer composed of aluminum gallium arsenide; the third solar subcell is composed of indium gallium arsenide; the fourth subcell is composed of germanium or InGaAs, GaAsSb, InAsP, InAlAs, or SiGeSn, InGaAsN, InGaAsNSb, InGaAsNBi, InGaAsNSbBi, InGaSbN, InGaBiN, InGaSbBiN, and the graded interlayer is composed of $(Al)In_xGa_{1-x}As$ or $In_xGa_{1-x}P$ with 0<x<1, and (Al) denotes that aluminum is an optional constituent.

In some embodiments, the first and second semiconductor bodies are separate semiconductor bodies that are disposed adjacent and parallel to each other. The semiconductor bodies being "parallel" to each other is meant that the bodies are disposed so that the incoming light illuminates both the upper first solar subcell of the first semiconductor body and the first solar subcell of the second semiconductor body, and that parallel light beams traverses the stack of subcells of each semiconductor body.

In some embodiments, the first and second semiconductor bodies constitute a single semiconductor body that has been etched to form two spatially separated and electrically interconnected bodies.

In some embodiments, the selection of the composition of the subcells, band gaps and short circuit current maximizes the efficiency at high temperature (in the range of 40 to 100 degrees Centigrade) in deployment in space at a predetermined time after the initial deployment (referred to as the beginning of life or BOL), such predetermined time being referred to as the end-of-life (EOL), such time being in the range of one to twenty-five years.

In some embodiments, the first and second semiconductor bodies further comprises a first highly doped lateral conduction layer disposed adjacent to and beneath the second solar subcell.

In some embodiments, the first and second semiconductor bodies further comprises a blocking p-n diode or insulating layer disposed adjacent to and beneath the first highly doped lateral conduction layer.

In some embodiments, the first and second semiconductor bodies further comprises a second highly doped lateral conduction layer disposed adjacent to and beneath the blocking p-n diode or insulating layer.

In some embodiments, the short circuit density ($J_{sc}$) of the first, second and third middle subcells are approximately 12 mA/cm$^2$. The short circuit density ($J_{sc}$/cm$^2$) of the subcells may have another value for different implementations.

In some embodiments, the short circuit current density ($J_{sc}$) of the bottom subcell is approximately 34 mA/cm$^2$.

In some embodiments, the short circuit density ($J_{sc}$) of the bottom subcell is at least three times that of the first, second and third subcells, and at least the base of at least one of the first, second or third solar subcells has a graded doping.

In some embodiments, the solar cell assembly further comprises a first opening in the first semiconductor body extending from a top surface of the semiconductor body to the first lateral conduction layer; a second opening in the first semiconductor body extending from the top surface of the first semiconductor body to the second lateral conduction layer; and a third opening in the first semiconductor body extending from a surface of the first semiconductor body to the p-type semiconductor material of the bottom subcell of the first semiconductor body.

In some embodiments, the solar cell assembly further comprises a first metallic contact pad disposed on the first lateral conduction layer of each of the first and second semiconductor bodies; and a second metallic contact pad disposed on the second lateral conduction layer of the first semiconductor body; and an electrical interconnect connecting the first and second contact pads.

In some embodiments, the solar cell assembly further comprises a third metallic contact pad disposed on the second lateral conduction layer of the second semiconductor body; a fourth metallic contact pad disposed on the p-type semiconductor material of the bottom subcell of the first semiconductor body; and an electrical interconnect connecting the third and fourth contact pads.

In another aspect, the present disclosure provides a multijunction solar cell assembly including a terminal of first polarity and a terminal of second polarity comprising first and second semiconductor bodies including substantially identical tandem vertical stacks of at least an upper first and a bottom second solar subcell lattice mismatched to the upper first solar subcell in which the second semiconductor body is mounted adjacent and parallel to the first semiconductor body; a bottom contact on the bottom second subcell of the second semiconductor body connected to the terminal of second polarity; a top electric contact on both the upper first subcells of the first and second semiconductor bodies electrically connected to the top electrical contacts to the terminal of first polarity; and an electrical interconnect connecting the bottom second subcell of the first semiconductor body in a series electrical circuit with the bottom second subcell of the second semiconductor body so that at least a multijunction solar cell is formed by the electrically interconnected semiconductor bodies. The series connection of the bottom subcell of the second semiconductor body incrementally increases the aggregate open circuit voltage of the assembly by 0.25 volts and the operating voltage by 0.21 volts, thereby increasing the power output of the assembly.

In another aspect, the present disclosure provides a method of forming a multijunction solar cell assembly including a terminal of first polarity and a terminal of second polarity comprising forming a semiconductor body including a tandem vertical stack of at least an upper first and a bottom second solar subcell lattice mismatched to the upper first solar subcell; separating the semiconductor body into first and second discrete semiconductor devices, each including the tandem vertical stack of at least an upper first and a bottom second solar subcells; mounting the second semiconductor body adjacent and parallel to the first semiconductor body; providing a bottom contact on the bottom second subcell of the second semiconductor body; connecting the bottom contact on the bottom second subcell of the second semiconductor body to the terminal of second polarity; connecting the bottom second subcell of the first semiconductor body in a series electrical circuit with the bottom second subcell of the second semiconductor body so that at least a multijunction solar cell is formed by the electrically interconnected semiconductor bodies; and providing a top electric contact on both the upper first subcells of the first and second semiconductor bodies and electrically connecting the top electrical contacts to the terminal of first polarity.

In another aspect, the present disclosure provides a multijunction solar cell subassembly including an upper first solar subcell composed of a semiconductor material having a first band gap; a second solar subcell adjacent to said first solar subcell and composed of a semiconductor material having a second band gap smaller than the first band gap and being lattice matched with the upper first solar subcell; a third solar subcell adjacent to said second solar subcell and composed of a semiconductor material having a third band gap smaller than the second band gap and being lattice matched with the second solar subcell; a graded interlayer adjacent to said third solar subcell, said graded interlayer having a fourth band gap greater than said third band gap; and a fourth solar subcell adjacent to said third solar subcell and being lattice mismatched with the third solar subcell and composed of a semiconductor material having a fifth band gap smaller than the fourth band gap; wherein the graded interlayer is compositionally graded to lattice match the third solar subcell on one side and the lower fourth solar subcell on the other side, and is composed of any of the As, P, N, Sb based III-V compound semiconductors subject to the constraints of having the in-plane lattice parameter less than or equal to that of the third solar subcell and greater than or equal to that of the lower fourth solar subcell, and wherein the average band gap of all four subcells (i.e., the sum of the four lowest direct or indirect band gaps of the materials of each subcell divided by four) is greater than 1.44 eV.

The solar cell subassembly can further include a plurality of openings in the first semiconductor body, each of the openings extending from a top surface of the first semiconductor body to a different respective contact layer in the first semiconductor body. Thus, for example, a first opening in the first semiconductor body can extend from the top surface of the semiconductor body to the first lateral conduction layer. A metallic contact pad can be disposed on the lateral conduction layer. A second opening in the first semiconductor body can extend from the top surface of the semiconductor body to the contact back metal layer of the bottom subcell.

In another aspect, the present disclosure provides a solar cell module including a terminal of first polarity and a terminal of second polarity comprising a first semiconductor body including a tandem vertical stack of at least a first upper, a second, third and fourth solar subcells which are current matched, the first upper subcell having a top contact connected to the terminal of first polarity and a bottom fourth solar subcell that is current mismatched from the first, second and third solar subcells; a second semiconductor body disposed adjacent to the first semiconductor body and including a tandem vertical stack of at least a first upper, second and third subcells, and a bottom fourth solar subcell that is current mismatched from the first, second and third solar subcells; wherein the top contact of the first upper subcells of the first and second semiconductor bodies are connected; and wherein the fourth subcell of the first semiconductor body is connected in a series electrical circuit with the fourth subcell of the second semiconductor body.

In another aspect, the present disclosure provides a method of forming a solar cell module including a terminal of first polarity and a terminal of second polarity comprising forming a first semiconductor body including a tandem vertical stack of at least a first upper, a second, third and fourth solar subcells which are current matched, the first upper subcell having a top contact connected to the terminal of first polarity and a bottom fourth solar subcell that is current mismatched from the first, second and third solar subcells; forming a second semiconductor body including a tandem vertical stack of at least a first upper, second and third subcells, and a bottom fourth solar subcell that is current mismatched from the first, second and third solar subcells; disposing the first semiconductor body adjacent to the second semiconductor body and connecting the top contact of the first upper subcells of the first and second semiconductor bodies; and connecting the fourth subcell of the first semiconductor body in a series electrical circuit with the fourth subcell of the second semiconductor body.

In some embodiments, the average band gap of all four subcells (i.e., the sum of the four band gaps of each subcell divided by four) in each semiconductor body is greater than 1.44 eV, and the fourth subcell is comprised of a direct or indirect band gap material such that the lowest direct band gap of the material is greater than 0.75 eV.

In some embodiments, the fourth subcell is comprised of a direct or indirect band gap material such that the lowest direct band gap of the material is less than 0.90 eV.

In some implementations, the first semiconductor body further includes one or more of the following features. For example, there may be a first highly doped lateral conduction layer disposed adjacent to the fourth solar subcell. The first semiconductor body also can include a blocking p-n diode or insulating layer disposed adjacent to and above the highly doped lateral conduction layer. The first semiconductor body may further include a second highly doped lateral conduction layer disposed adjacent to and above the blocking p-n diode or insulating layer. A metamorphic layer can be disposed adjacent to and above the second highly doped lateral conduction layer.

In another aspect, a solar cell assembly includes a terminal of first polarity and a terminal of second polarity. The solar cell assembly includes a first semiconductor body including a tandem vertical stack of at least a first upper, a second, a third and a lattice mismatched fourth solar subcell, the first upper subcell having a top contact connected to the terminal of first polarity. The solar cell assembly further includes a second semiconductor body disposed adjacent and parallel to the first semiconductor body and including a tandem vertical stack of at least a first upper, a second, third and a lattice mismatched fourth bottom solar subcells, the fourth bottom subcell having a bottom contact connected to the terminal of second polarity. The fourth subcell of the first semiconductor body is connected in a series electrical circuit with the fourth subcell of the second semiconductor body.

In some instances, the upper first subcell of the first semiconductor body is composed of aluminium indium gallium phosphide (AlInGaP); the second solar subcell of the first semiconductor body is disposed adjacent to and lattice matched to said upper first subcell, and is composed of aluminum indium gallium arsenide (Al(In)GaAs); and the third subcell is disposed adjacent to said second subcell and is composed of indium gallium arsenide (In)GaAs.

In some cases (e.g., for an assembly having two subassemblies), the short circuit density ($J_{sc}/cm^2$) of each of the first and second subcells is approximately 12 mA/cm$^2$. In other instances (e.g., for an assembly having three subassemblies), the short circuit density ($J_{sc}/cm^2$) of each of the first, second and third middle subcells is approximately 10 mA/cm$^2$. The short circuit density ($J_{sc}/cm^2$) of the bottom subcell in the foregoing cases can be approximately greater than 24 mA/cm$^2$ or greater than 30 mA/cm$^2$. However, the short circuit densities ($J_{sc}/cm^2$) may have different values in some implementations.

In some embodiments, the band gap of the interlayer is in the range of 1.41 to 1.6 eV throughout its thickness, and may be either constant or may be a graded interlayer and vary throughout the thickness of the interlayer.

In some embodiments, there further comprises a distributed Bragg reflector (DBR) layer adjacent to and between the third and the fourth solar subcells and arranged so that light can enter and pass through the third solar subcell and at least a portion of which can be reflected back into the third solar subcell by the DBR layer.

In some embodiments, the distributed Bragg reflector layer is composed of a plurality of alternating layers of lattice matched materials with discontinuities in their respective indices of refraction.

In some embodiments, the difference in refractive indices between alternating layers is maximized in order to minimize the number of periods required to achieve a given reflectivity, and the thickness and refractive index of each period determines the stop band and its limiting wavelength.

In some embodiments, the DBR layer includes a first DBR layer composed of a plurality of p type $Al_xGa_{1-x}(In)As$ layers, and a second DBR layer disposed over the first DBR layer and composed of a plurality of n type or p type $Al_yGa_{1-y}(In)As$ layers, where $0<x<1$, $0<y<1$, and y is greater than x, and (In) designates that indium is an optional constituent.

In another aspect, the present disclosure provides a five junction solar cell comprising a pair of adjacently disposed semiconductor bodies, each body including an upper first solar subcell composed of a semiconductor material having a first band gap; a second solar subcell adjacent to said first solar subcell and composed of a semiconductor material having a second band gap smaller than the first band gap and being lattice matched with the upper first solar subcell; a third solar subcell adjacent to said second solar subcell and composed of a semiconductor material having a third band gap smaller than the second band gap and being lattice matched with the second solar subcell; and a fourth solar subcell adjacent to and lattice mismatched to said third solar subcell and composed of a semiconductor material having a fourth band gap smaller than the third band gap; wherein the average band gap of all four subcells (i.e., the sum of the four band gaps of each subcell divided by four) is greater than 1.44 eV.

In another aspect, the present disclosure provides a four junction solar cell subassembly comprising an upper first solar subcell composed of a semiconductor material having a first band gap; a second solar subcell adjacent to said first solar subcell and composed of a semiconductor material having a second band gap smaller than the first band gap and being lattice matched with the upper first solar subcell; a third solar subcell adjacent to said second solar subcell and composed of a semiconductor material having a third band gap smaller than the second band gap and being lattice matched with the second solar subcell; a graded interlayer adjacent to said third solar subcell, said graded interlayer having a fourth band gap greater than said third band gap; and a fourth solar subcell adjacent to said third solar subcell and composed of a semiconductor material having a fifth band gap smaller than the fourth band gap and being lattice mismatched with the third solar subcell; wherein the graded interlayer is compositionally graded to lattice match the third solar subcell on one side and the lower fourth solar subcell on the other side, and is composed of any of the As, P, N, Sb based III-V compound semiconductors subject to the constraints of having the in-plane lattice parameter less than or equal to that of the third solar subcell and greater than or equal to that of the lower fourth solar subcell; wherein the fourth subcell is comprised of a direct or indirect band gap material such that the lowest direct band gap of the material is greater than 0.75 eV. In other instances, the fourth subcell may have a direct band gap of less than 0.90 eV.

In another aspect, the present disclosure provides a method of manufacturing a five junction solar cell comprising providing a germanium substrate; growing on the germanium substrate a sequence of layers of semiconductor material using a MOCVD semiconductor disposition process to form a solar cell comprising a plurality of subcells including a metamorphic layer, growing a third subcell over the metamorphic layer having a band gap of approximately 1.30 eV to 1.41 eV, growing a second subcell over the third subcell having a band gap in the range of approximately 1.65 to 1.8 eV, and growing an upper first subcell over the second subcell having a band gap in the range of 2.0 to 2.20 eV.

In some embodiments, there further comprises (i) a back surface field (BSF) layer disposed directly adjacent to the bottom surface of the third subcell, and (ii) at least one distributed Bragg reflector (DBR) layer directly below the BSF layer so that light can enter and pass through the first, second and third subcells and at least a portion of which be reflected back into the third subcell by the DBR layer.

In some embodiments, the fourth (i.e., bottom) subcell of each of the solar cell subassemblies is composed of germanium. The indirect band gap of the germanium at room temperature is about 0.66 eV, while the direct band gap of germanium at room temperature is 0.8 eV. Those skilled in the art with normally refer to the "band gap" of germanium as 0.66 eV, since it is lower than the direct band gap value of 0.8 eV. Thus, in some implementations, the fourth subcell has a direct band gap of greater than 0.75 eV. Reference to the fourth subcell having a direct band gap of greater than 0.75 eV is expressly meant to include germanium as a possible semiconductor material for the fourth subcell, although other semiconductor materials can be used as well. In other instances, the fourth subcell may have a direct band gap of less than 0.90 eV. For example, the fourth subcell may be composed of InGaAs, GaAsSb, InAsP, InAlAs, or SiGeSn, InGaAsN, InGaAsNSb, InGaAsNBi, or other III-V or II-VI compound semiconductor materials.

In some embodiments, additional layer(s) may be added or deleted in the cell structure without departing from the scope of the present disclosure.

Some implementations can include additional solar subcells in one or more of the semiconductor bodies.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein.

GLOSSARY OF TERMS

Figure 1:
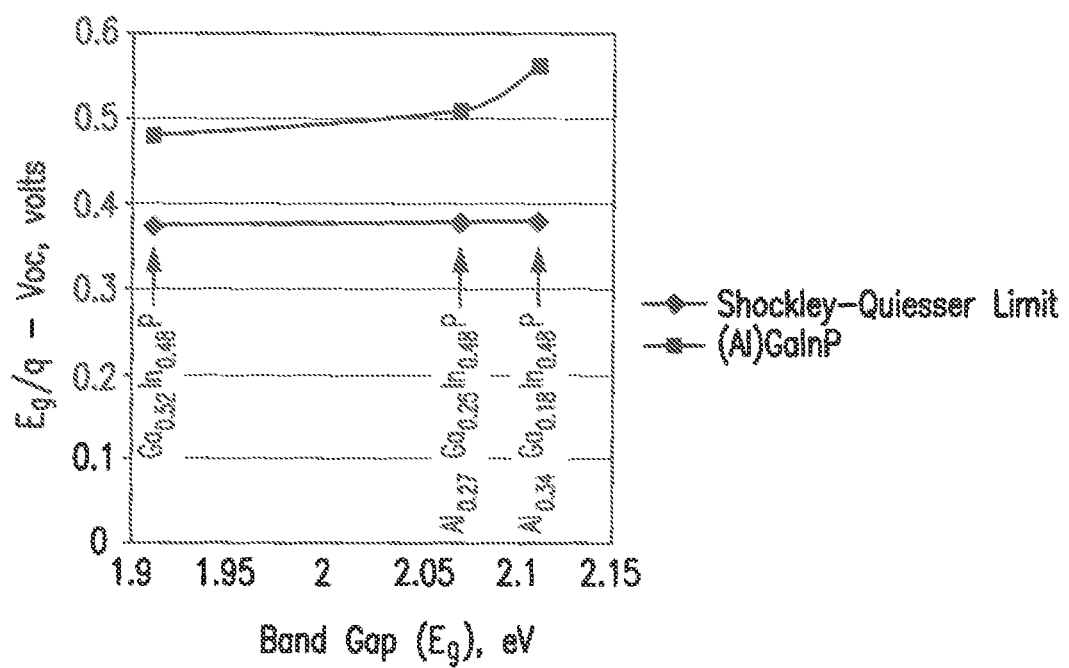
FIG. 1 is a graph representing the BOL value of the parameter $E_g/q-V_{oc}$ at 28° C. plotted against the band gap of certain ternary and quaternary materials defined along the x-axis.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which would normally be the "top" subcells facing the solar radiation in the final deployment configuration, are deposited or grown on a growth substrate prior to depositing or growing the lower band gap subcells.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in-plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electronic device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells (as well as inverted metamorphic multijunction solar cells) are disclosed in the related applications noted above. Some, many or all of such features may be included in the structures and processes associated with the non-inverted or "upright" solar cells of the present disclosure. However, more particularly, the present disclosure is directed to the fabrication of a multijunction lattice matched solar cell grown over a metamorphic layer which is grown on a single growth substrate which forms a solar cell subassembly. More specifically, however, in some embodiments, the present disclosure relates to multijunction solar cell subassemblies with direct band gaps in the range of 2.0 to 2.15 eV (or higher) for the top subcell, and (i) 1.65 to 1.8 eV, and (ii) 1.41 eV for the middle subcells, and 0.6 to 0.9 eV direct or indirect band gaps, for the bottom subcell, respectively, and the connection of two or more such subassemblies to form a solar cell assembly.

The conventional wisdom for many years has been that in a monolithic multijunction tandem solar cell, " . . . the desired optical transparency and current conductivity between the top and bottom cells . . . would be best achieved by lattice matching the top cell material to the bottom cell material. Mismatches in the lattice constants create defects or dislocations in the crystal lattice where recombination centers can occur to cause the loss of photogenerated minority carriers, thus significantly degrading the photovoltaic quality of the device. More specifically, such effects will decrease the open circuit voltage ($V_{oc}$), short circuit current ($J_{sc}$), and fill factor (FF), which represents the relationship or balance between current and voltage for effective output"

(Jerry M. Olson, U.S. Pat. No. 4,667,059, "Current and Lattice Matched Tandem Solar Cell").

As progress has been made toward higher efficiency multijunction solar cells with four or more subcells, nevertheless, "it is conventionally assumed that substantially lattice-matched designs are desirable because they have proven reliability and because they use less semiconductor material than metamorphic solar cells, which require relatively thick buffer layers to accommodate differences in the lattice constants of the various materials" (Rebecca Elizabeth Jones-Albertus et al., U.S. Pat. No. 8,962,993).

Even more recently " . . . current output in each subcell must be the same for optimum efficiency in the series—connected configuration" (Richard R. King et al., U.S. Pat. No. 9,099,595).

The present disclosure provides an unconventional four junction design (with three grown lattice matched subcells, which are lattice mismatched to the Ge substrate) that leads to significant performance improvement over that of traditional three junction solar cell on Ge despite the substantial current mismatch present between the top three junctions and the bottom Ge junction. This performance gain is especially realized at high temperature and after high exposure to space radiation by the proposal of incorporating high band gap semiconductors that are inherently more resistant to radiation and temperature.

As described in greater detail, the present application further notes that interconnecting two or more spatially split multijunction solar cell subassemblies (with each subassembly incorporating Applicant's unconventional design) can be even more advantageous. The spatial split can be provided for multiple solar cell subassemblies monolithically formed on the same substrate. Alternatively, the solar cell subassemblies can be fabricated as separate semiconductor chips that can be coupled together electrically.

In general terms, a solar cell assembly in accordance with one aspect of the present disclosure, can include a terminal of first polarity and a terminal of second polarity. The solar cell assembly includes a first semiconductor subassembly including a tandem vertical stack of at least a first upper, a second, third and fourth bottom solar subcells, the first upper subcell having a top contact connected to the terminal of first polarity. A second semiconductor subassembly is disposed adjacent to the first semiconductor subassembly and includes a tandem vertical stack of at least a first upper, a second, third, and fourth bottom solar subcells, the fourth bottom subcell having a back side contact connected to the terminal of second polarity. The fourth subcell of the first semiconductor subassembly is connected in a series electrical circuit with the third subcell of the second semiconductor subassembly. Thus, a five-junction solar assembly is assembled from two four-junction solar cell subassemblies.

In some cases, the foregoing solar cell assembly can provide increased photoconversion efficiency in a multijunction solar cell for outer space or other applications over the operational life of the photovoltaic power system.

Another aspect of the present disclosure is that to provide a five junction solar cell assembly composed of two interconnected spatially separated four junction solar cell subassemblies, the average band gap of all four subcells (i.e., the sum of the four band gaps of each subcell divided by 4) in each solar cell subassembly being greater than 1.44 eV.

Another descriptive aspect of the present disclosure is to characterize the fourth subcell as being composed of an indirect or direct band gap material such that the lowest direct band gap is greater than 0.75 eV, in some embodiments.

Another descriptive aspect of the present disclosure is to characterize the fourth subcell as being composed of a direct band gap material such that the lowest direct band gap is less than 0.90 eV, in some embodiments.

In some embodiments, the fourth subcell in each solar cell subassembly is germanium, while in other embodiments the fourth subcell is InGaAs, GaAsSb, InAsP, InAlAs, or SiGeSn, InGaAsN, InGaAsNSb, InGaAsNBi, InGaAsNSbBi, InGaSbN, InGaBiN, InGaSbBiN or other III-V or II-VI compound semiconductor material.

The indirect band gap of germanium at room temperature is about 0.66 eV, while the direct band gap of germanium at room temperature is 0.8 eV. Those skilled in the art will normally refer to the "band gap" of germanium as 0.66 eV, since it is lower than the direct band gap value of 0.8 eV.

The recitation that "the fourth subcell has a direct band gap of greater than 0.75 eV" is therefore expressly meant to include germanium as a possible semiconductor for the fourth subcell, although other semiconductor materials can be used as well.

More specifically, the present disclosure intends to provide a relatively simple and reproducible technique that does not employ inverted processing associated with inverted metamorphic multijunction solar cells, and is suitable for use in a high volume production environment in which various semiconductor layers are grown on a growth substrate in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

The lattice constants and electrical properties of the layers in the semiconductor structure are preferably controlled by specification of appropriate reactor growth temperatures and times, and by use of appropriate chemical composition and dopants. The use of a deposition method, such as Molecular Beam Epitaxy (MBE), Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type.

The present disclosure is directed to, in one embodiment, a growth process using a metal organic chemical vapor deposition (MOCVD) process in a standard, commercially available reactor suitable for high volume production. More particularly, the present disclosure is directed to the materials and fabrication steps that are particularly suitable for producing commercially viable multijunction solar cells using commercially available equipment and established high-volume fabrication processes, as contrasted with merely academic expositions of laboratory or experimental results.

Prior to discussing the specific embodiments of the present disclosure, a brief discussion of some of the issues associated with the design of multijunction solar cells, and in particular metamorphic solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes and suited for specific applications such as the space environment where the efficiency over the entire operational life is an important goal, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

In view of the foregoing, it is further evident that the identification of one particular constituent element (e.g. indium, or aluminum) in a particular subcell, or the specification of the thickness, band gap, doping, or other characteristic of the incorporation of that material in a particular subcell, is interdependent on many other factors, and thus is not a single, simple "result effective variable" that one skilled in the art can simply specify and incrementally adjust to a particular level and thereby increase the efficiency of a solar cell at the beginning of life or the end of life, or over a particular time span of operational use. The efficiency of a solar cell is not a simple linear algebraic equation as a function of band gap, or the amount of gallium or aluminum or other element in a particular layer. The growth of each of the epitaxial layers of a solar cell in an MOCVD reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Another aspect of the disclosure is to match the larger short circuit current of the bottom subcell of the solar cell assembly with two or three parallel stacks of solar subcells, i.e. a configuration in which the value of the short circuit current of the bottom subcell is at least twice, or at least three times, that of the solar subcells in each parallel stack which are connected in series with the bottom subcell. Stated another way, given the choice of the composition of the bottom subcell, and thereby the short circuit current of the bottom subcell, the upper subcell stack is specified and designated to have a short circuit current which is one-third or less or is one-half or less than that of the bottom subcell.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, in a given environment over the operational life, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and "unexpected results", and constitute an "inventive step" in designing and specifying a solar cell to operate in a predetermined environment (such as space), not only at the beginning of life, but over the entire defined operational lifetime.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One aspect of the present disclosure relates to the use and amount of aluminum in the active layers of the upper subcells in a multijunction solar cell (i.e. the subcells that are closest to the primary light source). The effects of increasing amounts of aluminum as a constituent element in an active layer of a subcell affects the photovoltaic device performance. One measure of the "quality" or "goodness" of a solar cell subcell or junction is the difference between the band gap of the semiconductor material in that subcell or junction and the $V_{oc}$, or open circuit voltage, of that same junction. The smaller the difference, the higher the $V_{oc}$ of the solar cell junction relative to the band gap, and the better the performance of the device. $V_{oc}$ is very sensitive to semiconductor material quality, so the smaller the $E_g/q - V_{oc}$ of a device, the higher the quality of the material in that device. (The charge q is introduced in the denominator for normalization purposes, since the band gap of a semiconductor material is measured in electron volts which is dimensioned in units of energy, and thus to compare the terms with the open circuit voltage, measured in volts, the band gap is divided by the charge in coulombs, which is $1.6\times10^{-19}$ coulombs, to produce a parameter also measured in volts). There is a theoretical limit to this difference, known as the Shockley-Queisser limit. That is the best voltage that a solar cell junction can produce under a given concentration of light at a given temperature.

The experimental data obtained for single junction (Al) GaInP solar cells indicates that increasing the Al content of the junction leads to a larger $E_g/q-V_{oc}$ difference, indicating that the material quality of the junction decreases with increasing Al content. FIG. 1 shows this effect. The three compositions cited in the Figure are all lattice matched to GaAs, but have differing Al composition. As seen by the different compositions represented, with increasing amount of aluminum represented by the x-axis, adding more Al to the semiconductor composition increases the band gap of the junction, but in so doing also increases $E_g/q-V_{oc}$. Hence, we draw the conclusion that adding Al to a semiconductor material degrades that material such that a solar cell device made out of that material does not perform relatively as well as a junction with less Al.

Thus, contrary to the conventional wisdom as indicated above, the present application utilizes a substantial amount of aluminum, i.e., between 10% and 40% aluminum by mole fraction in at least the top subcell, and in some embodiments in one or more of the middle subcells as well. In some embodiments the amount of aluminum in each of the top three subcells is in excess of 20% by mole fraction.

Figure 2A:
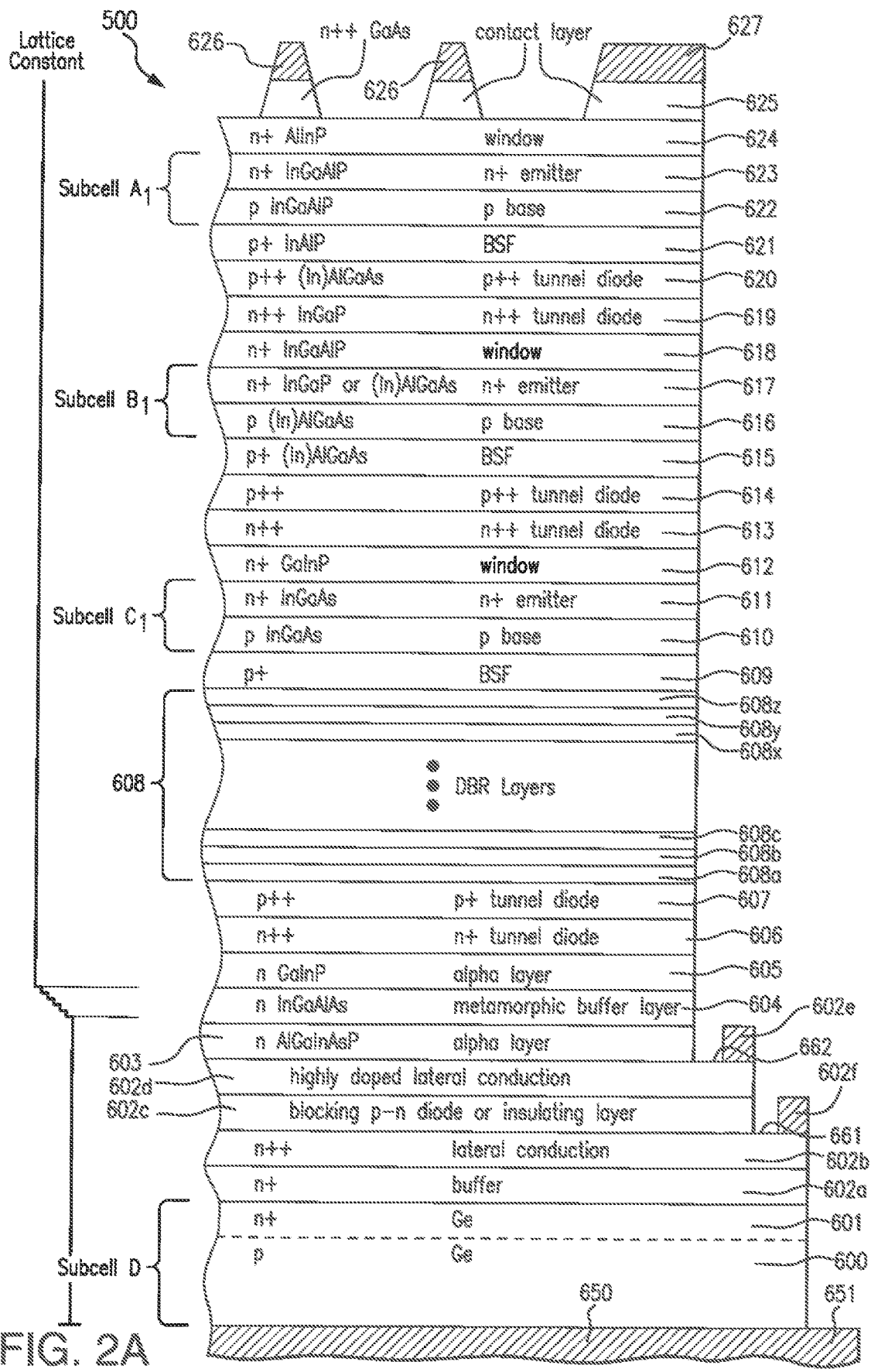
FIG. 2A is a cross-sectional view of a first embodiment of a first semiconductor body including a four junction solar cell after several stages of fabrication including the growth of certain semiconductor layers on the growth substrate up to the contact layer and etching contact steps on lower levels according to the present disclosure.

Turning to the fabrication of the multijunction solar cell assembly of the present disclosure, and in particular a five-junction solar cell assembly, FIG. 2A is a cross-sectional view of a first embodiment of a four junction solar cell subassembly 500 after several stages of fabrication including the growth of certain semiconductor layers on the growth substrate, and formation of grids and contacts on the contact layer of the semiconductor body.

As shown in the illustrated example of FIG. 2A, the bottom subcell $D_1$ includes a substrate 600 formed of p-type germanium ("Ge") in some embodiments, which also serves as a base layer. A back metal contact pad 650 formed on the bottom of base layer 600 provides electrical contact 651 to the multijunction solar cell subassembly 500.

In some embodiments, the contact 651 may be in the interior of the region 600 and not on the bottom surface of the region 600.

In some embodiments, the bottom subcell $D_1$ is germanium, while in other embodiments the fourth subcell is InGaAs, GaAsSb, InAsP, InAlAs, or SiGeSn, InGaAsN, InGaAsNSb, InGaAsNBi, InGaAsNSbBi, InGaSbN, InGaBiN, InGaSbBiN or other III-V or II-VI compound semiconductor material.

The bottom subcell $D_1$, further includes, for example, a highly doped n-type Ge emitter layer 601, and an n-type indium gallium arsenide ("InGaAs") nucleation layer 602a. The nucleation layer 602a is deposited over the base layer, and the emitter layer 601 is formed in the substrate by diffusion of atoms from the nucleation layer 602a into the Ge substrate, thereby forming the n-type Ge layer 601.

In the first solar cell subassembly 500 of FIG. 2A, a highly doped lateral conduction layer 602b is deposited over layer 602a, and a blocking p-n diode or insulating layer 602c is deposited over the layer 602b. A second highly doped lateral conduction layer 602d is then deposited over layer 602c.

In the embodiment of FIG. 2A, a first alpha layer 603, composed of n-type (Al)GaIn(As)P, is deposited over the lateral conduction layer 602d, to a thickness of between 0.25 and 1.0 micron. Such an alpha layer is intended to prevent threading dislocations from propagating, either opposite to the direction of growth into the bottom subcell $D_1$, or in the direction of growth into the subcell $C_1$, and is more particularly described in U.S. Patent Application Pub. No. 2009/0078309 A1 (Cornfeld et al.).

A metamorphic layer (or graded interlayer) 604 is deposited over the alpha layer 603 using a surfactant. Layer 604 is preferably a compositionally step-graded series of InGaAlAs layers, preferably with monotonically changing lattice constant, so as to achieve a gradual transition in lattice constant in the semiconductor structure from subcell $D_1$ to subcell $C_1$ while minimizing threading dislocations from occurring. The band gap of layer 604 is either constant throughout its thickness, in one embodiment approximately equal to 1.42 to 1.62 eV, or otherwise consistent with a value slightly greater than the band gap of the middle subcell $C_1$, or may vary within the above noted region. One embodiment of the graded interlayer may also be expressed as being composed of $(Al)In_xGa_{1-x}As$, with $0<x<1$, and x selected such that the band gap of the interlayer is in the range of at approximately 1.42 to 1.62 eV or other appropriate band gap.

In the surfactant assisted growth of the metamorphic layer 604, a suitable chemical element is introduced into the reactor during the growth of layer 604 to improve the surface characteristics of the layer. In one embodiment, such element may be a dopant or donor atom such as selenium (Se) or tellurium (Te). Small amounts of Se or Te are therefore incorporated in the metamorphic layer 604, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 606.

In one embodiment of the present disclosure, the layer 604 is composed of a plurality of layers of (Al)InGaAs, with monotonically changing lattice constant, each layer having a band gap, approximately in the range of 1.42 to 1.62 eV. In some embodiments, the band gap is in the range of 1.45 to 1.55 eV. In some embodiments, the band gap is in the range of 1.5 to 1.52 eV.

The advantage of utilizing the embodiment of a constant bandgap material such as InGaAs is that arsenide-based semiconductor material is much easier to process in standard commercial MOCVD reactors.

Although the preferred embodiment of the present disclosure utilizes a plurality of layers of (Al)InGaAs for the metamorphic layer 604 for reasons of manufacturability and radiation transparency, other embodiments of the present disclosure may utilize different material systems to achieve a change in lattice constant from subcell $C_1$ to subcell $D_1$. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater than or equal to that of the third solar cell and less than or equal to that of the fourth solar cell, and having a bandgap energy greater than that of the third solar cell.

A second alpha layer 605, composed of n+ type GaInP, is deposited over metamorphic buffer layer 604, to a thickness of between 0.25 and about 1.0 micron. Such second alpha layer is intended to prevent threading dislocations from propagating, either opposite to the direction of growth into the subcell $D_1$, or in the direction of growth into the subcell $C_1$, and is more particularly described in U.S. Patent Application Pub. No. 2009/0078309 A1 (Cornfeld et al.).

Heavily doped p-type aluminum gallium arsenide ("AlGaAs") and heavily doped n-type indium gallium arsenide ("(In)GaAs") tunneling junction layers 606, 607 may be deposited over the alpha layer 605 to provide a low resistance pathway between the bottom and middle subcells $D_1$ and $C_1$.

In some embodiments, distributed Bragg reflector (DBR) layers 608 are then grown adjacent to and between the tunnel junction 606/607 and the third solar subcell $C_1$. The DBR layers 608 are arranged so that light can enter and pass through the third solar subcell $C_1$ and at least a portion of which can be reflected back into the third solar subcell $C_1$ by the DBR layers 608. In the embodiment depicted in FIG. 2A, the distributed Bragg reflector (DBR) layers 608 are specifically located between the third solar subcell C and tunnel junction layers 607; in other embodiments, the distributed Bragg reflector tunnel diode layers 606/607 may be located between DBR layer 608 and the third subcell $C_1$. In another embodiment, depicted in FIG. 2C, the tunnel diode layer 670/671 are located between the lateral conduction layer 602d and the first alpha layer 606.

For some embodiments, distributed Bragg reflector (DBR) layers 608 can be composed of a plurality of alternating layers 608a through 608z of lattice matched materials with discontinuities in their respective indices of refraction. For certain embodiments, the difference in refractive indices between alternating layers is maximized in order to minimize the number of periods required to achieve a given reflectivity, and the thickness and refractive index of each period determines the stop band and its limiting wavelength.

For some embodiments, distributed Bragg reflector (DBR) layers 608a through 608z includes a first DBR layer composed of a plurality of p type $Al_x(In)Ga_{1-x}As$ layers, and a second DBR layer disposed over the first DBR layer and composed of a plurality of p type $Al_y(In)Ga_{1-y}As$ layers, where y is greater than x, with $0<x<1$, $0<y<1$.

On top of the DBR layers 608 the subcell $C_1$ is grown.

In the illustrated example of FIG. 2A, the subcell $C_1$ includes a highly doped p-type aluminum gallium arsenide ("Al(In)GaAs") back surface field ("BSF") layer 609, a p-type InGaAs base layer 610, a highly doped n-type indium gallium phosphide ("InGaP2") emitter layer 611 and a highly doped n-type indium aluminum phosphide ("AlInP2") window layer 612. The InGaAs base layer 610 of the subcell $C_1$ can include, for example, approximately 1.5% In. Other compositions may be used as well. The base layer 610 is formed over the BSF layer 609 after the BSF layer is deposited over the DBR layers 608a through 608z.

The window layer 612 is deposited on the emitter layer 611 of the subcell $C_1$. The window layer 612 in the subcell $C_1$ also helps reduce the recombination loss and improves passivation of the cell surface of the underlying junctions. Before depositing the layers of the subcell B, heavily doped n-type InGaP and p-type Al(In)GaAs (or other suitable compositions) tunneling junction layers 613, 614 may be deposited over the subcell $C_1$.

The middle subcell $B_1$ includes a highly doped p-type aluminum (indium) gallium arsenide ("Al(In)GaAs") back surface field ("BSF") layer 615, a p-type Al(In)GaAs base layer 616, a highly doped n-type indium gallium phosphide ("InGaP2") or Al(In)GaAs layer 617 and a highly doped n-type indium gallium aluminum phosphide ("AlGaAlP") window layer 618. The InGaP emitter layer 617 of the subcell $B_1$ can include, for example, approximately 50% In. Other compositions may be used as well.

Before depositing the layers of the top cell $A_1$, heavily doped n-type InGaP and p-type Al(In)GaAs tunneling junction layers 619, 620 may be deposited over the subcell B.

In the illustrated example, the top subcell $A_1$ includes a highly doped p-type indium aluminum phosphide ("InAlP") BSF layer 621, a p-type InGaAlP base layer 622, a highly doped n-type InGaAlP emitter layer 623 and a highly doped n-type InAlP2 window layer 624. The base layer 623 of the top subcell $A_1$ is deposited over the BSF layer 621 after the BSF layer 621 is formed over the tunneling junction layers 619, 620 of the subcell $B_1$. The window layer 624 is deposited over the emitter layer 623 of the top subcell $A_1$ after the emitter layer 623 is formed over the base layer 622.

In some embodiments, the amount of aluminum in the top subcell A, is 20% or more by mole fraction.

A cap or contact layer 625 may be deposited and patterned into separate contact regions over the window layer 624 of the top subcell $A_1$. The cap or contact layer 625 serves as an electrical contact from the top subcell $A_1$ to metal grid 626. The doped cap or contact layer 625 can be a semiconductor layer such as, for example, a GaAs or InGaAs layer.

After the cap or contact layer 625 is deposited, the grid lines 626 are formed via evaporation and lithographically patterned and deposited over the cap or contact layer 625.

A contact pad 627 connected to the grid 626 is formed on one edge of the subassembly 500 to allow an electrical interconnection to be made, inter alia, to an adjacent subassembly.

As with the first solar cell subassembly 500, the subcells $A_2$, $B_2$, $C_2$ of the second solar cell subassembly 700 can be configured so that the short circuit current densities of the three subcells $A_2$, $B_2$, $C_2$ have a substantially equal predetermined first value (J1<=J2<=J3), and the short circuit current density (J4) of the bottom subcell $D_2$ is at least twice that of the predetermined first value.

Following deposition of the semiconductor layers, the semiconductor body 500 is etched so that several ledges or platforms are formed on intermediate layers so that electrical contact may be made thereto, in particular, in one embodiment, ledges 651, 661, and 662.

To this end, the solar cell subassembly can include a plurality of openings in the first semiconductor body, each of the openings extending from a top surface of the first semiconductor body to a different respective contact layer in the first semiconductor body. Such "openings" may include recesses, cavities, holes, gaps, cut-outs, or similar structures, but for simplicity we will subsequently just use the term "opening" throughout this disclosure. In other implementations, we can etch through the rear of the substrate and have all the openings come from the back side. This approach may be more efficient as it does not shadow the top two or top three solar subcells, but it results in a solar epitaxial structure of only a few tens of microns in thickness.

Figure 2B:
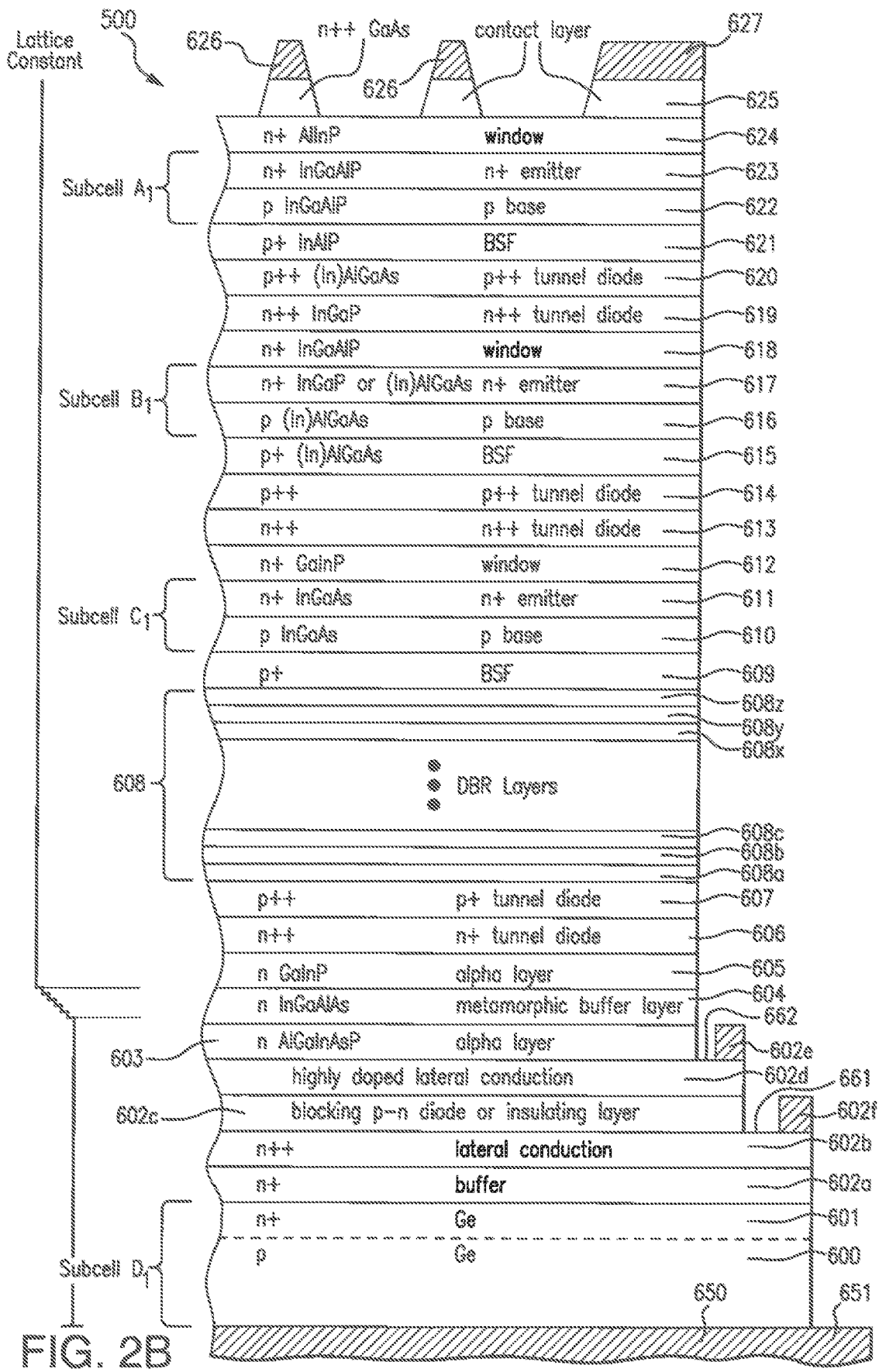
FIG. 2B is a cross-sectional view of a first embodiment of a first semiconductor body of FIG. 2A after the next step of depositing a metal contact on the top surface.

FIG. 2B is a cross-sectional view of the multijunction solar cell subassembly 500 of FIG. 2A after additional stages of fabrication including the deposition of metal contact pads on the ledges depicted in FIG. 2A.

A metal contact pad 602e is deposited on the surface of the ledge of 662 which exposes a portion of the top surface of the lateral conduction layer 602d. This pad 602e allows electrical contact to be made to the bottom of the stack of subcells $A_1$ through $C_1$.

A metal contact pad 602f is deposited on the surface of the ledge of 661 which exposes a portion of the top surface of the lateral conduction layer 602b. This pad 602f allows electrical contact to be made to the top of the subcell $D_1$.

A metal contact 651 is further provided to a ledge 650 in the p-region of the substitute 600, or as part of the back metal layer 660 which allows electrical contact to be made to the p-terminal of subcell $D_1$.

The solar cell subassemblies, 150 and 250 are presented in a highly simplified form, but each represent the structure 500 of FIG. 2.

Figure 2C:
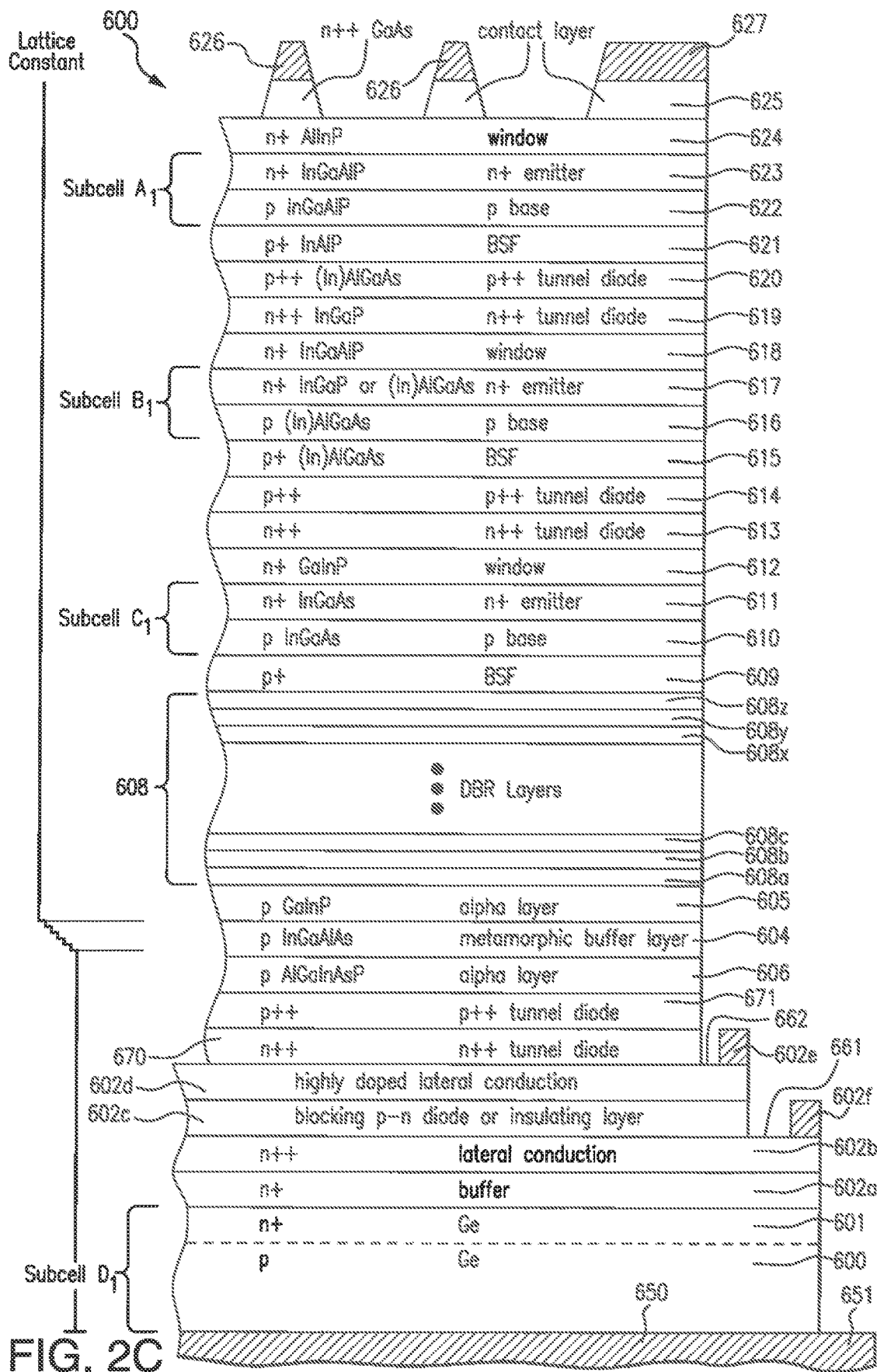
FIG. 2C is a cross-sectional view of a second embodiment of a first semiconductor body of FIG. 2A.

A second solar cell subassembly 700, which is similar to the solar cell subassembly 500 or 600 of FIG. 2B or 2C, respectively, may be formed with substantially the same sequence of semiconductor layers with the same compositions and band gaps as the corresponding layers in the first solar cell subassembly 500 or 600. Thus, the solar cell subassembly 700 also includes multiple subcells in a tandem stack. In the illustrated example of FIG. 3, the second solar cell subassembly 700 includes an upper first subcell (Subcell $A_2$), a second and third solar subcells (Subcell $B_2$ and $C_2$) disposed adjacent to and lattice matched to the upper first subcell $A_2$, and a bottom subcell (Subcell $D_2$) lattice mismatched to the third subcell $C_2$.

As with the first solar cell subassembly 500, the subcells $A_2$, $B_2$, $C_2$ of the second solar cell subassembly 700 can be configured so that the short circuit current densities of the three subcells $A_2$, $B_2$, $C_2$ have a substantially equal predetermined first value (J1=J2=J3), and the short circuit current density (J4) of the bottom subcell $D_2$ is at least twice that of the predetermined first value.

Since the semiconductor layers 700 through 725 in subassembly 700 are substantially identical to layers 600 through 625 in subassembly 500, a detailed description of them will not be illustrated or provided here for brevity.

Figure 3:
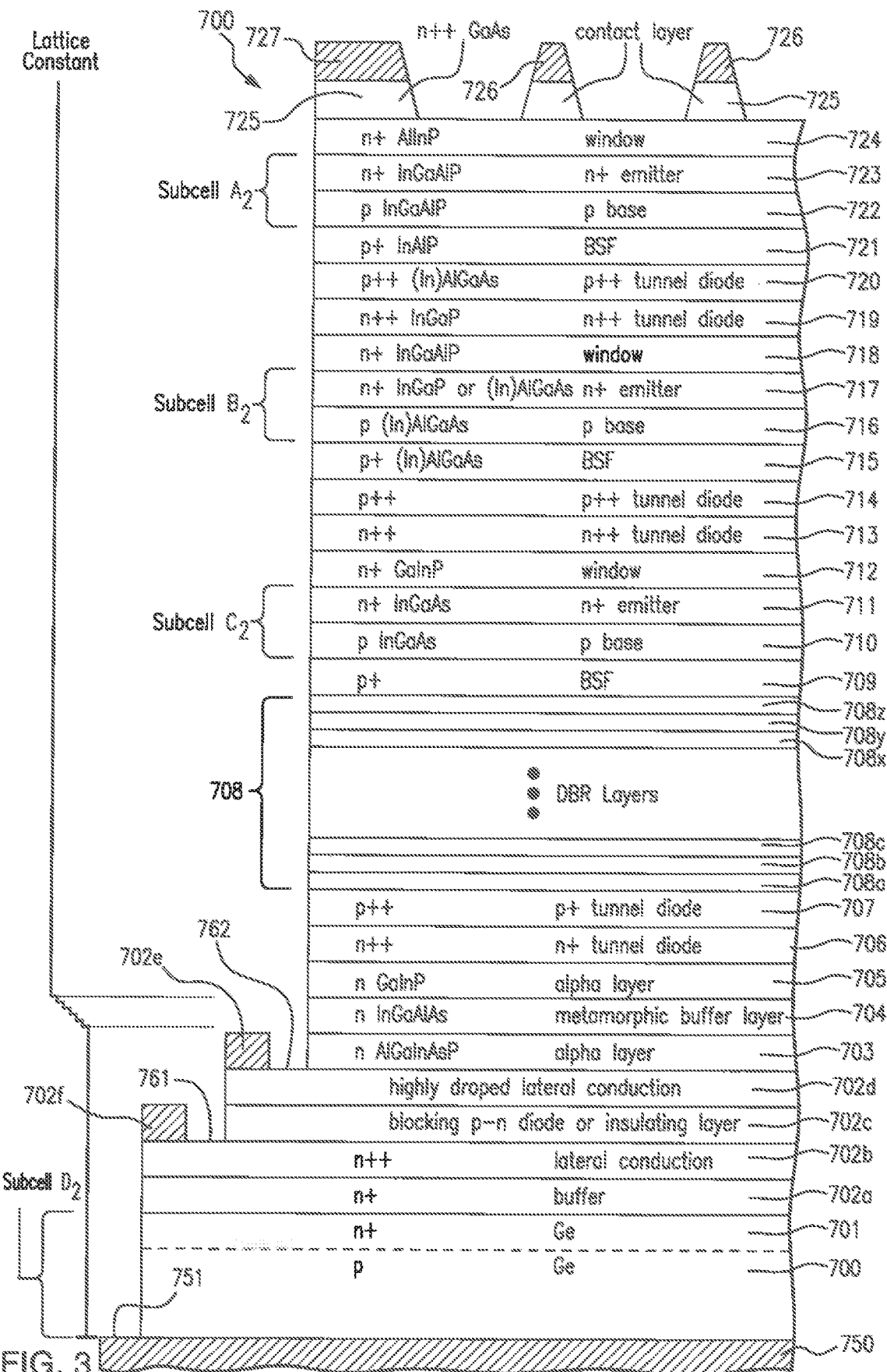
FIG. 3 is a cross-sectional view of a first embodiment of a second semiconductor body including a four junction solar cell after several stages of fabrication including the growth of certain semiconductor layers on the growth substrate up to the contact layer, according to the present disclosure.

In order to provide access to the various layers in the second solar cell subassembly 700, various ones of the layers can be exposed partially. Thus, as shown in the example of FIG. 3, various surfaces are partially exposed on the left side of the subassembly 700, for example, using standard photolithographic etching techniques to etch from the top surface of the semiconductor body 700 to the particular contact layer 762, 761 and 751 of interest.

A metal contact pad 703e is deposited on the surface of the ledge of 762 which exposes a portion of the top surface of the lateral conduction layer 702d. This pad 702e allows electrical contact to be made to the bottom of the stack of subcells $A_2$ through $C_2$.

A metal contact pad 702f is deposited on the surface of the ledge of 761 which exposes a portion of the top surface of the lateral conduction layer 702b. This pad 702f allows electrical contact to be made to the top of the subcell E.

A metal contact 751 is further provided as part of the back metal layer 750 which allows electrical contact to be made to the p-terminal of subcell E.

A second embodiment of the second solar cell subassembly similar to that of FIG. 2C is another configuration (not shown) with that the metamorphic buffer layer 604 is disposed above the tunnel diode layers 706, 707 and below the DBR layers 708 (not illustrated).

The foregoing multijunction solar cell subassemblies 500, 600, or 700 can be fabricated, for example, in wafer-level processes and then singulated or diced into individual semiconductor chips. The various semiconductor layers can be grown, one atop another, using known growth techniques (e.g., MOCVD) as discussed above.

Each solar cell subassembly 500, 600 and 700 also can include grid lines, interconnecting bus lines, and contact pads. The geometry and number of the grid lines, bus lines and/or contacts may vary in other implementations.

Figure 4:
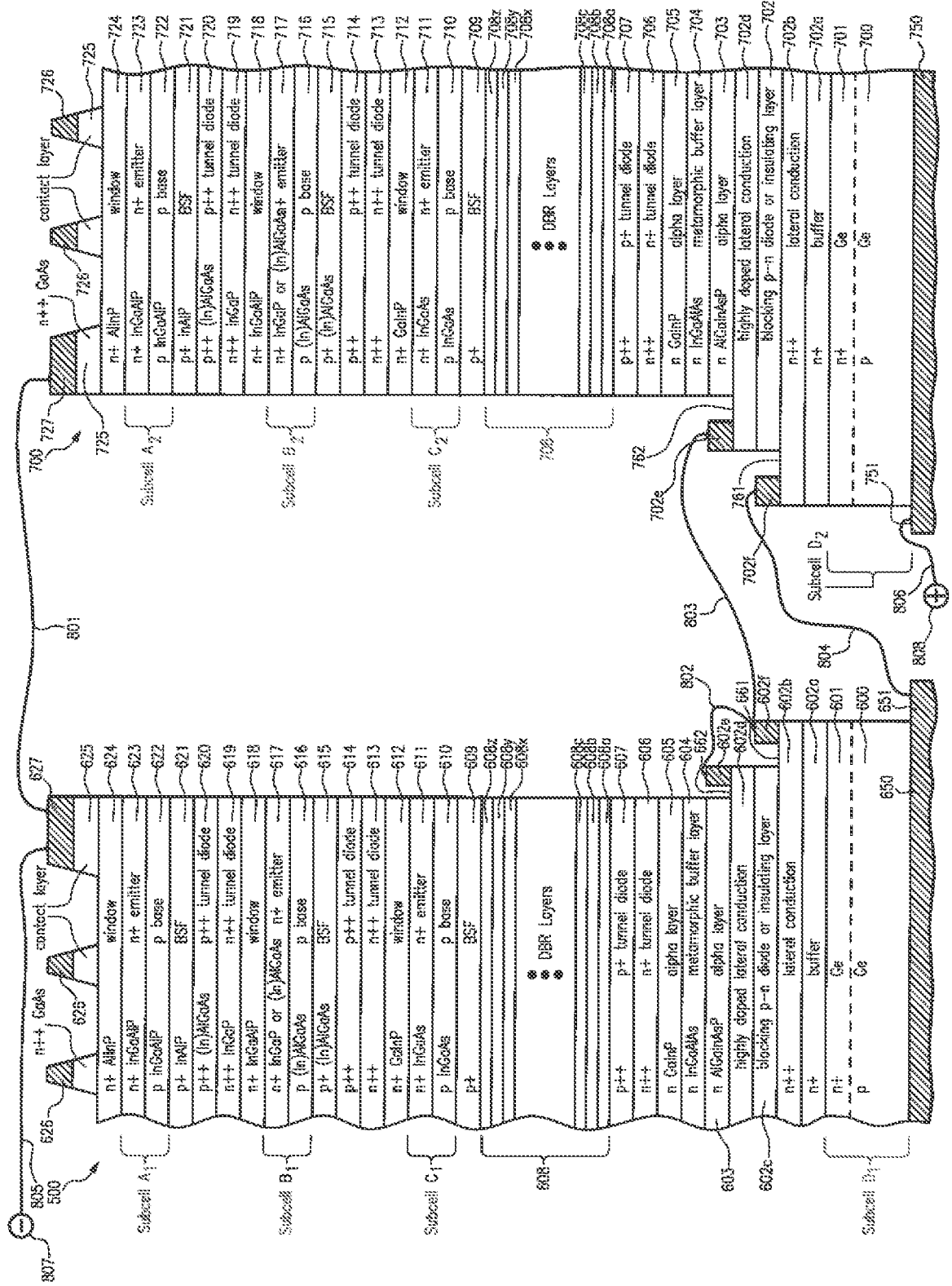
FIG. 4 is a cross-sectional view of an embodiment of a five junction solar cell after following electrical connection of the first and second semiconductor bodies according to the present disclosure.

As previously mentioned, two (or more) solar cell subassemblies (e.g., 500 and 700) or chips can be disposed adjacent and parallel to one another and connected together electrically. For example, as shown in FIG. 4, conductive (e.g., metal) interconnections 801, 802, 803, and 804 can be made between different layers of the solar cell subassemblies 500 and 700. Some of the interconnections are made between different layers of a single one of the solar cell subassemblies, whereas others of the interconnections are made between the two different solar cell subassemblies. Thus, for example, the interconnection 801 electrically connects together the metal contacts 133 and 233 of the first and second solar cell subassemblies 150 and 250 respectively. In particular, interconnection 803 connects together a contact on the lateral conduction layer 104B of the first solar cell subassembly 150 to a contact on the lateral conduction layer 204b of the second solar cell subassembly 250. Similarly, the interconnection 804 connects together a contact 130 on the p-region 102 of the first solar cell subassembly 150 to a contact 231 on the lateral conduction layer 204a of the second solar cell subassembly 250. Likewise, the interconnection 802 connects together a contact 132 on the lateral conduction layer 104b of the first solar cell subassembly 150 to a contact 131 on the lateral conduction layer 104a of the first solar cell subassembly 150.

In some instances, multiple electrically conductive (e.g., metal) contacts can be provided for each of the respective contacts of the solar cell subassemblies 150, 250. This allows each of the interconnections 801-804 to be implemented by multiple interconnections between the solar cell subassembly layers rather than just a single interconnection.

As noted above, the solar cell assembly includes a first electrical contact of a first polarity and a second electrical contact of a second polarity. In some embodiments, the first electrical contact 807 is connected to the metal contact 160 on the first solar cell subassembly 150 by an interconnection 805, and the second electrical contact 808 is connected to the back metal contact 217 of the second solar cell subassembly 250.

As illustrated in FIG. 4, two or more solar cell subassemblies can be connected electrically as described above to obtain a multijunction (e.g. a four-, five- or six-junction) solar cell assembly. In FIG. 4, the top side (n-polarity) conductivity contact 807 and bottom side (p-polarity) conductive contact 808 for the solar cell assembly are schematically depicted respectively, at the left and right-hand sides of the assembly.

In the example of FIG. 4, one solar cell subassembly 150 includes an upper subcell $A_1$, two middle subcells $B_1$, $C_1$ and a bottom subcell $D_1$. The other solar cell subassembly includes an upper subcell $A_2$, two middle subcells $B_2$, $C_2$ and a bottom subcell $D_2$. In some implementations, each solar cell subassembly 500, 700 has band gaps in the range of 2.0 to 2.20 eV (or higher) for the top subcell, and (i) 1.65 to 1.8, and (ii) 1.41 eV for the middle subcell, and 0.6 to 0.9 eV, for the bottom subcell, respectively, Further, in some embodiments, the average band gap of all four subcells (i.e., the sum of the four band gaps of each subcell divided by four) in a given solar cell subassembly 500 or 700 is greater than 1.44 eV. Other band gap ranges may be appropriate for some implementations.

In some instances, the fourth (i.e., bottom) subcell is composed of germanium. The indirect band gap of the germanium at room temperature is about 0.66 eV, while the direct band gap of germanium at room temperature is 0.8 eV. Those skilled in the art with normally refer to the "band gap" of germanium as 0.66 eV, since it is lower than the direct band gap value of 0.8 eV. Thus, in some implementations, the fourth subcell has a direct band gap of greater than 0.75 eV. Reference to the fourth subcell having a direct band gap of greater than 0.75 eV is expressly meant to include germanium as a possible semiconductor material for the fourth subcell, although other semiconductor materials can be used as well. For example, the fourth subcell may be composed of InGaAs, GaAsSb, InAsP, InAlAs, or SiGeSn, or other III-V or II-VI compound semiconductor materials.

Figure 5:
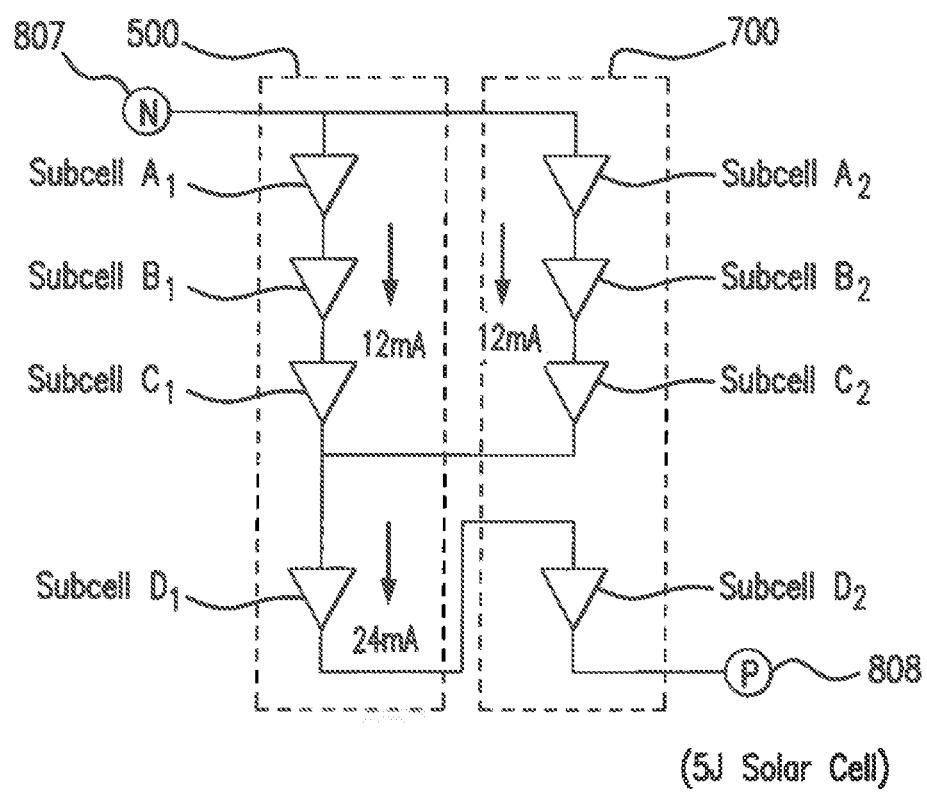
FIG. 5 is a schematic diagram of the five junction solar cell of FIG. 4.

FIG. 5 is a schematic diagram of the five junction solar cell assembly of FIG. 4.

In some implementations of a five-junction solar cell assembly, such as in the example of FIG. 5, the short circuit density ($J_{sc}$) of the upper first subcells ($A_1$ and $A_2$) and the middle subcells ($B_1$, $B_2$, $C_1$, $C_2$) is about 12 mA/cm$^2$, and the short circuit current density ($J_{sc}$) of the bottom subcells ($D_1$ and $D_2$) is about 24 mA/cm$^2$ or greater. Other implementations may have different values.

FIG. 6 is a graph of a doping profile in the emitter and base layers in one or more subcells of the multijunction solar cell of the present invention. The various doping profiles within the scope of the present invention, and the advantages of such doping profiles are more particularly described in U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

The present disclosure like that of the parallel applications noted above provides a multijunction solar cell that follows a design rule that one should incorporate as many high band gap subcells as possible to achieve the goal to increase the efficiency at high temperature EOL. For example, high band gap subcells may retain a greater percentage of cell voltage as temperature increases, thereby offering lower power loss as temperature increases. As a result, both high temperature beginning-of-life (HT-BOL) and HT-EOL performance of the exemplary multijunction solar cell, according to the present disclosure, may be expected to be greater than traditional cells.

The open circuit voltage ($V_{oc}$) of a compound semiconductor subcell loses approximately 2 mV per degree C. as the temperature rises, so the design rule taught by the present disclosure takes advantage of the fact that a higher band gap (and therefore higher voltage) subcell loses a lower percentage of its $V_{oc}$ with temperature. For example, a subcell that produces a 1.50V at 28° C. produces 1.50-42*(0.0023)= 1.403V at 70° C. which is a 6.4% voltage loss, A cell that produces 0.25V at 28° C. produces 0.25-42*(0.0018)= 0.174V at 70° which is a 30.2% voltage loss.

In view of different satellite and space vehicle requirements in terms of temperature, radiation exposure, and operational life, a range of subcell designs using the design principles of the present disclosure may be provided satisfying typical customer and mission requirements, and several embodiments are set forth hereunder, along with the computation of their efficiency at the end-of-life. The radiation exposure is experimentally measured using 1 MeV electron fluence per square centimeter (abbreviated in the text that follows as e/cm$^2$), so that a comparison can be made between the current commercial devices and embodiments of solar cells discussed in the present disclosure.

As an example, a low earth orbit (LEO) satellite will typically experience radiation equivalent to 5×10$^{14}$ e/cm$^2$ over a five year lifetime. A geosynchronous earth orbit (GEO) satellite will typically experience radiation in the range of 5×10$^{14}$ e/cm$^2$ to 1×10 e/cm$^2$ over a fifteen year lifetime.

For example, the cell efficiency (%) measured at room temperature (RT) 28° C. and high temperature (HT) 70° C., at beginning of life (BOL) and end of life (EOL), for a standard three junction commercial solar cell (e.g. a SolAero Technologies Corp. Model ZTJ), such as depicted in FIG. 2 of U.S. patent application Ser. No. 14/828,206, is as follows:

| Condition | Efficiency | |
|---|---|---|
| BOL 28° C. | 29.1% | |
| BOL 70° C. | 26.4% | |
| EOL 70° C. | 23.4% | After 5E14 e/cm$^2$ radiation |
| EOL 70° C. | 22.0% | After 1E15 e/cm$^2$ radiation |

For the 5J solar cell assembly (comprising two interconnected four-junction subassemblies) described in the present disclosure, the corresponding data is as follows:

| Condition | Efficiency | |
|---|---|---|
| BOL 28° C. | 30.6% | |
| BOL 70° C. | 27.8% | |
| EOL 70° C. | 26.6% | After 5E14 e/cm$^2$ radiation |
| EOL 70° C. | 26.1% | After 1E15 e/cm$^2$ radiation |

The new solar cell of the present disclosure has a slightly higher cell efficiency than the standard commercial solar cell (ZTJ) at BOL at 70° C. However, more importantly, the solar cell described in the present disclosure exhibits substantially improved cell efficiency (%) over the standard commercial solar cell (ZTJ) at 1 MeV electron equivalent fluence of 5×10$^{14}$ e/cm$^2$, and dramatically improved cell efficiency (%) over the standard commercial solar cell (ZTJ) at 1 MeV electron equivalent fluence of 1×10$^{15}$ e/cm$^2$.

The wide range of electron and proton energies present in the space environment necessitates a method of describing the effects of various types of radiation in terms of a radiation environment which can be produced under laboratory conditions. The methods for estimating solar cell degradation in space are based on the techniques described by Brown et al. [Brown, W. L., J. D. Gabbe, and W. Rosenzweig, Results of the Telstar Radiation Experiments, Bell System Technical J., 42, 1505, 1963] and Tada [Tada, H. Y., J. R. Carter, Jr., B. E. Anspaugh, and R. G. Downing, Solar Cell Radiation Handbook, Third Edition, JPL Publication 82-69, 1982]. In summary, the omnidirectional space radiation is converted to a damage equivalent unidirectional fluence at a normalised energy and in terms of a specific radiation particle. This equivalent fluence will produce the same damage as that produced by omnidirectional space radiation considered when the relative damage coefficient (RDC) is properly defined to allow the conversion. The relative damage coefficients (RDCs) of a particular solar cell structure are measured a priori under many energy and fluence levels. When the equivalent fluence is determined for a given space environment, the parameter degradation can be evaluated in the laboratory by irradiating the solar cell with the calculated fluence level of unidirectional normally incident flux. The equivalent fluence is normally expressed in terms of 1 MeV electrons or 10 MeV protons.

The software package Spenvis (www.spenvis.oma.be) is used to calculate the specific electron and proton fluence that a solar cell is exposed to during a specific satellite mission as defined by the duration, altitude, azimuth, etc. Spenvis employs the EQFLUX program, developed by the Jet Propulsion Laboratory (JPL) to calculate 1 MeV and 10 MeV damage equivalent electron and proton fluences, respectively, for exposure to the fluences predicted by the trapped radiation and solar proton models for a specified mission environment duration. The conversion to damage equivalent fluences is based on the relative damage coefficients determined for multijunction cells [Marvin, D. C., Assessment of Multijunction Solar Cell Performance in Radiation Environments, Aerospace Report No. TOR-2000 (1210)-1, 2000]. A widely accepted total mission equivalent fluence for a geosynchronous satellite mission of 15 year duration is 1 MeV $1 \times 10^{15}$ electrons/cm$^2$.

The exemplary solar cell described herein may require the use of aluminum in the semiconductor composition of each of the top two subcells. Aluminum incorporation is widely known in the III-V compound semiconductor industry to degrade BOL subcell performance due to deep level donor defects, higher doping compensation, shorter minority carrier lifetimes, and lower cell voltage and an increased BOL $E_g/q-V_{oc}$ metric. However, consideration of the EOL $E_g/q-V_{oc}$ metric, or more generally, total power output over a defined predetermined operational life, in the present disclosure presents a different approach. In short, increased BOL $E_g/q-V_{oc}$ may be the most problematic shortcoming of aluminum containing subcells; the other limitations can be mitigated by modifying the doping schedule or thinning base thicknesses.

For completeness and clarification in the recitation of various claimed elements with corresponding elements depicted in the Figure, an annotated set of claims with reference numbers is set forth in the following clauses:

Clause 1 . . . A multijunction solar cell assembly having a terminal of a first polarity and a terminal of a second polarity (808) comprising:
(a) a first semiconductor body (500) including:
  an upper first solar subcell (A1) composed of a semiconductor material having a first band gap, and including a top contact (627) on the top surface thereof;
  a second solar subcell (B1) adjacent to said first solar subcell (A1) and composed of a semiconductor material having a second band gap smaller than the first band gap and being lattice matched with the upper first solar subcell (A1);
  a third solar subcell (C1) adjacent to said second solar subcell (B1) and composed of a semiconductor material having a third band gap smaller than the second band gap and being lattice matched with the second solar subcell (B1);
  an interlayer adjacent to said third solar subcell (C1), said interlayer having a fourth band gap or band gaps greater than said third band gap; and a fourth solar subcell (D1) adjacent to said interlayer and composed of a semiconductor material having a fifth band gap smaller than the fourth band gap and being lattice mismatched with the third solar subcell (C1), and including a first contact (602f) on the top surface thereof, and a second contact (650) on the bottom surface thereof,
(b) a second semiconductor body (700) disposed adjacent and parallel to the first semiconductor body (500) and including:
  an upper first solar subcell (A2) composed of a semiconductor material having a first band gap, and including a top contact (727) on the top surface thereof,
  a second solar subcell (B2) adjacent to said first solar subcell (A2) and composed of a semiconductor material having a second band gap smaller than the first band gap and being lattice matched with the upper first solar subcell (A2);
  a third solar subcell (C2) adjacent to said second solar subcell (B2) and composed of a semiconductor material having a third band gap smaller than the second band gap and being lattice matched with the second solar subcell (B2) and having a bottom contact (702e);
  an interlayer adjacent to said third solar subcell (C2), said interlayer having a fourth band gap greater than said third band gap; and
  a fourth solar subcell (D2) adjacent to said interlayer and composed of a semiconductor material having a fifth band gap smaller than the fourth band gap and being lattice mismatched with the third solar subcell (C2), and including a first contact (702f) on the top surface thereof, and a second contact (750) on the bottom surface thereof connected to the terminal of a second polarity (808);
(c) wherein the top contact (625) of the first semiconductor body (500) is electrically coupled with the top contact (725) of the second semiconductor body (700) and to a terminal of first polarity (807);
  wherein the first contact (602f) on the top surface of the fourth solar subcell (D1) of the first semiconductor body (500) is electrically coupled with the bottom contact (702e) of the third solar subcell (C2) of the second semiconductor body (700);
  the second contact (650) on the bottom surface of the fourth solar subcell (D1) of the first semiconductor body (500) is electrically coupled with the first contact (702f) on the top surface of the fourth solar subcell (D2) of the second semiconductor body (700) thereof so as to form a five junction solar cell;
  and wherein the interlayer in each of the first and second semiconductor bodies (500, 700) is compositionally graded to substantially lattice match the third solar subcell (C1, C2) on one side and the lower fourth solar subcell (D1, D2) on the other side, and is composed of any of the As, P, N, Sb based III-V compound semiconductors subject to the constraints of having the in-plane lattice parameter less than or equal to that of the third solar subcell (C1, C2) and greater than or equal to that of the lower fourth solar subcell (D1, D2).

Clause 2 . . . A multijunction solar cell as defined in clause 1, wherein the short circuit density of each fourth subcell (D1, D2) being at least twice that of the solar subcells in each semiconductor body which are connected in a series with the fourth subcell (D1, D2).

Clause 3 . . . A multijunction solar cell as defined in clause 1, wherein the fourth subcell (D1, D2) has a band gap of approximately 0.67 eV, the third subcell (C1, C2) has a band gap in the range of approximately 1.41 eV and 1.31 eV, the second subcell (B1, B2) has a band gap in the range of approximately 1.65 to 1.8 eV and the upper first subcell (A1, A2) has a band gap in the range of 2.0 to 2.20 eV.

Clause 4 . . . A multijunction solar cell as defined in clause 1, wherein the upper first subcell (A1, A2) is composed of indium gallium aluminum phosphide;

the second solar subcell (B1, B2) includes an emitter layer composed of indium gallium phosphide or aluminum gallium arsenide or indium aluminum gallium arsenide, and a base layer composed of aluminum gallium arsenide, indium gallium arsenide phosphide or indium aluminum gallium arsenide;

the third solar subcell (C1, C2) is composed of indium gallium arsenide;

the fourth subcell (D1, D2) is composed of germanium.

Clause 5 . . . A multijunction solar cell as defined in clause 1, wherein the interlayer is composed of p type $(Al)In_xGa_{1-x}As$ or $In_xGa_{1-x}P$ with $0<x<1$, and (Al) designates that aluminum is an optional constituent.

Clause 6 . . . A multijunction solar cell as defined in clause 1, wherein the first (500) and second (700) semiconductor bodies further comprise a first highly doped lateral conduction layer (602b) disposed adjacent to and above the fourth solar subcell (D1) and a blocking p-n diode or insulating layer (602c) disposed adjacent to and above the first highly doped lateral conduction layer (602b), and a second highly doped lateral conduction layer disposed (602d) adjacent to and above the blocking p-n diode or insulating layer (602c).

Clause 7 . . . A multijunction solar cell assembly as defined in clause 3, wherein the third subcell (C1, C2) has a band gap of approximately 1.37 eV, the second subcell (B1, B2) has a band gap of approximately 1.73 eV and the upper first subcell (A1, A2) has a band gap of approximately 2.10 eV.

Clause 8 . . . A multijunction solar cell assembly as defined in clause 1, wherein the band gap of the interlayer is in the range of 1.41 eV to 1.6 eV throughout its thickness.

Clause 9 . . . A multijunction solar cell assembly as defined in clause 1, further comprising:

a distributed Bragg reflector layer (608) adjacent to and between the third (C1, C2) and the fourth (D1, D2) solar subcells and arranged so that light can enter and pass through the third solar subcell (C1, C2) and at least a portion of which can be reflected back into the third solar subcell (C1, C2) by the distributed Bragg reflector layer (608), and the distributed Bragg reflector layer (608) is composed of a plurality of alternating layers of lattice matched materials with discontinuities in their respective indices of refraction and the difference in refractive indices between alternating layers is maximized in order to minimize the number of periods required to achieve a given reflectivity, and the thickness and refractive index of each period determines the stop band and its limiting wavelength, and wherein the distributed Bragg reflector layer (608) includes a first distributed Bragg reflector layer (608) composed of a plurality of p type $Al_xGa_{1-x}(In)As$ layers, and a second distributed Bragg reflector layer (608) disposed over the first distributed Bragg reflector layer (608) and composed of a plurality of n type or p type $Al_yGa_{1-y}(In)As$ layers, where $0<x<1$, $0<y<1$, and y is greater than x, and (In) designates that indium is an optional constituent.

Clause 10 . . . A multijunction solar cell assembly as defined in clause 2, wherein the short circuit current density ($J_{sc}$) of the first (A1, A2), second (B1, B2) and third middle (C1, C2) subcells are approximately 11 mA/cm$^2$, and the short circuit current density ($J_{sc}$) of the bottom subcell (D1, D2) is approximately 34 mA/cm$^2$.

Clause 11 . . . A multijunction solar cell assembly as defined in clause 1, wherein at least the base of at least one of the first (A1, A2), second (B1, B2) or third (C1, C2) solar subcells has a graded doping.

Clause 12 . . . A multijunction solar cell assembly as defined in clause 6 comprising:

a first opening in the first semiconductor body (500) extending from a top surface of the semiconductor body to the first lateral conduction layer (602b);

a second opening in the first semiconductor body (500) extending from the top surface of the semiconductor body (500) to the second lateral conduction layer (602d); and a third opening in the first semiconductor body (500) extending from a surface of the first semiconductor body (500) to the p-type semiconductor material of the bottom subcell (D1), a first metallic contact pad (602f, 702f) disposed on the first lateral conduction layer (602b) of each of the first (500) and second (700) semiconductor bodies;

a second metallic contact pad (602e) disposed on the second lateral conduction layer (602d) of the first semiconductor body (500); and an electrical interconnect connecting the first and second contact pads, a third metallic contact pad (702e) disposed on the second lateral conduction layer (702d) of the second semiconductor body (700);

a fourth metallic contact pad (651) disposed on the p-type semiconductor material of the bottom subcell (D1) of the first semiconductor body (500); and an electrical interconnect (804) connecting the third and fourth (651) contact pads.

Clause 13 . . . A multijunction solar cell assembly having a terminal of a first polarity (807) and a terminal of a second polarity (808) comprising:

(a) a first semiconductor body (500) including:

an upper first solar subcell (A1) composed of a semiconductor material having a first band gap, and including a top contact (627) on the top surface thereof;

a second solar subcell (B1) adjacent to said first solar subcell (A1) and composed of a semiconductor material having a second band gap smaller than the first band gap and being lattice matched with the upper first solar subcell (A1);

a third solar subcell (C1) adjacent to said second solar subcell (B1) and composed of a semiconductor material having a third band gap smaller than the second band gap and being lattice matched with the second solar subcell (B1);

a fourth solar subcell (D1) adjacent to said interlayer and composed of a semiconductor material having a fifth band gap smaller than the fourth band gap, and including a first contact (602f) on the top surface thereof, and a second contact (650) on the bottom surface thereof;

(b) a second semiconductor body (700) disposed adjacent and parallel to the first semiconductor body (500) and including:

an upper first solar subcell (A2) composed of a semiconductor material having a first band gap, and including a top contact (727) on the top surface thereof;

a second solar subcell (B2) adjacent to said first solar subcell (A2) and composed of a semiconductor material having a second band gap smaller than the first band gap and being lattice matched with the upper first solar subcell (A2);

a third solar subcell (C2) adjacent to said second solar subcell (B2) and composed of a semiconductor material having a third band gap smaller than the second band gap and being lattice matched with the second solar subcell (B2) and having a bottom contact (702e);
a fourth solar subcell (D2) adjacent to said interlayer and composed of a semiconductor material having a fifth band gap smaller than the fourth band gap, and including a first contact (702e) on the top surface thereof, and a second contact (750) on the bottom surface thereof connected to the terminal of a second polarity (808);
(c) wherein the top contact (625) of the first semiconductor body (500) is electrically coupled with the top contact (725) of the second semiconductor body (700) and to a terminal of first polarity (807);
wherein the first contact (602f) on the top surface of the fourth solar subcell (D1) of the first semiconductor body (500) is electrically coupled with the bottom contact (702e) of the third solar subcell (C2) of the second semiconductor body (700);
the second contact (650) on the bottom surface of the fourth solar subcell (D1) of the first semiconductor body (500) is electrically coupled with the first contact (702f) on the top surface of the fourth solar subcell (D2) of the second semiconductor body (700) thereof so as to form a five junction solar cell;
wherein the first and second semiconductor bodies further comprise a first highly doped lateral conduction layer disposed adjacent to and above the fourth solar subcell (D1) and a blocking p-n diode or insulating layer disposed adjacent to and above the first highly doped lateral conduction layer, and a second highly doped lateral conduction layer disposed adjacent to and above the blocking p-n diode or insulating layer.

Clause 14 . . . A multijunction solar cell as defined in clause 1, wherein the fourth subcell (D1, D2) has a band gap of approximately 0.67 eV, the third subcell (C1, C2) has a band gap in the range of approximately 1.41 eV and 1.31 eV, the second subcell (B1, B2) has a band gap in the range of approximately 1.65 to 1.8 eV and the upper first subcell (A1, A2) has a band gap in the range of 2.0 to 2.20 eV.

Clause 15 . . . A multijunction solar cell as defined in clause 13, wherein the upper first subcell (A1, A2) is composed of indium gallium aluminum phosphide;
the second solar subcell (B1, B2) includes an emitter layer composed of indium gallium phosphide or aluminum gallium arsenide or indium aluminum gallium arsenide, and a base layer composed of aluminum gallium arsenide, indium gallium arsenide phosphide or indium aluminum gallium arsenide;
the third solar subcell (C1, C2) is composed of indium gallium arsenide; and the fourth subcell (D1, D2) is composed of germanium.

Clause 16 . . . A multijunction solar cell assembly as defined in clause 13, further comprising:
a distributed Bragg reflector layer adjacent to and between the third (C1, C2) and the fourth (D1, D2) solar subcells are arranged so that light can enter and pass through the third solar subcell (C1, C2) and at least a portion of which can be reflected back into the third solar subcell (C1, C2) by the distributed Bragg reflector layer (608), and the distributed Bragg reflector layer (608) is composed of a plurality of alternating layers of lattice matched materials with discontinuities in their respective indices of refraction and the difference in refractive indices between alternating layers is maximized in order to minimize the number of periods required to achieve a given reflectivity, and the thickness and refractive index of each period determines the stop band and its limiting wavelength, and wherein the distributed Bragg reflector layer (608) includes a first distributed Bragg reflector layer (608) disposed over the first distributed Bragg reflector layer (608) and composed of a plurality of n type or p type $Al_yGa_{1-y}$(In)As layers, where $0<x<1$, $0<y<1$, and y is greater than x, and (In) designates that indium is an optional constituent.

Clause 17 . . . A multijunction solar cell assembly as defined in clause 13, wherein the short circuit current density ($J_{sc}$) of the first (A1, A2), second (B1, B2) and third middle (C1, C2) subcells are approximately 11 mA/cm$^2$, and the short circuit current density ($J_{sc}$) of the bottom subcell (D1, D2) is approximately 34 mA/cm$^2$.

Clause 18 . . . A multijunction solar cell assembly as defined in clause 13, wherein at least the base of at least one of the first (A1, A2), second (B1, B2) or third (C1, C2) solar subcells has a graded doping.

Clause 19 . . . A multijunction solar cell assembly as defined in clause 13, comprising: a first opening in the first semiconductor body (500) extending from a top surface of the semiconductor body (500) to the first lateral conduction layer (602b);
a second opening in the first semiconductor body (500) extending from the top surface of the semiconductor body (500) to the second lateral conduction layer (602d);
a third opening in the first semiconductor body (500) extending from a surface of the first semiconductor body (500) to the p-type semiconductor material of the bottom subcell (D1), a first metallic contact pad (602f, 702f) disposed on the first lateral conduction layer (602b) of each of the first (500) and second (700) semiconductor bodies;
a second metallic contact pad (602e) disposed on the second lateral conduction layer (602d) of the first semiconductor body (500); and
an electrical interconnect connecting the first and second contact pads, a third metallic contact pad (702e) disposed on the second lateral conduction layer (702d) of the second semiconductor body (700);
a fourth metallic contact pad (651) disposed on the p-type semiconductor material of the bottom subcell (D1) of the first semiconductor body (500); and
an electrical interconnect (804) connecting the third and fourth (651) contact pads.

Clause 20 . . . A multijunction solar cell assembly including a terminal of first polarity and a terminal of second polarity comprising:
first and second semiconductor bodies including substantially identical tandem vertical stacks of at least an upper first and a bottom second solar subcell lattice mismatched to the upper first solar subcell in which the second semiconductor body is mounted adjacent and parallel to the first semiconductor body;
a bottom contact on the bottom second subcell of the second semiconductor body connected to the terminal of second polarity;
a top electric contact on both the upper first subcells of the first and second semiconductor bodies electrically connected to the top electrical contacts to the terminal of first polarity; and
an electrical interconnect connecting the bottom second subcell of the first semiconductor body in a series electrical circuit with the bottom second subcell of the second semiconductor body so that at least a three junction solar cell is formed by the electrically interconnected semiconductor bodies;

wherein the first and second semiconductor bodies further comprise a first highly doped lateral conduction layer disposed adjacent to and above the bottom second solar subcell and a blocking p-n diode or insulating layer disposed adjacent to and above the first highly doped lateral conduction layer, and a second highly doped lateral conduction layer disposed adjacent to and above the blocking p-n diode or insulating layer.

It will be understood that each of the elements described above, or two or more together, also may find a useful application in other types of structures or constructions differing from the types of structures or constructions described above.

Although described embodiments of the present disclosure utilizes a vertical tandem stack of four subcells, various aspects and features of the present disclosure can apply to tandem stacks with fewer or greater number of subcells, i.e. two junction cells, three junction cells, five junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n+ type InGaAlP is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, GaP, InP, GaSb, AlSb, InAs, InSb, ZnSe, AlGaInP, AlGaAsP, AlGaInAs, AlGaInPAs, GaInP, GaInAs, GaInPAs, (In)AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, GaInNAsSb, GaNAsSb, GaNAsInBi, GaNAsSbBi, GaNAsInBiSb, AlGaInNAs, ZnSSe, CdSSe, SiGe, SiGeSn, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A multijunction solar cell assembly having a terminal of a first polarity and a terminal of a second polarity comprising:

(a) a first semiconductor body including:
an upper first solar subcell (A1) composed of a semiconductor material having a first band gap, and including a top contact on the top surface thereof,
a second solar subcell (B1) adjacent to said first solar subcell (A1) and composed of a semiconductor material having a second band gap smaller than the first band gap and being lattice matched with the upper first solar subcell (A1);
a third solar subcell (C1) adjacent to said second solar subcell (B1) and composed of a semiconductor material having a third band gap smaller than the second band gap and being lattice matched with the second solar subcell (B1);
an interlayer adjacent to said third solar subcell (C1), said interlayer having a fourth band gap or band gaps greater than said third band gap; and
a fourth solar subcell (D1) adjacent to said interlayer and composed of a semiconductor material having a fifth band gap smaller than the fourth band gap and being lattice mismatched with the third solar subcell (C1), and including a first contact on the top surface thereof, and a second contact on the bottom surface thereof, (b) a second semiconductor body disposed adjacent and parallel to the first semiconductor body and including:
an upper first solar subcell (A2) composed of a semiconductor material having a first band gap, and including a top contact on the top surface thereof,
a second solar subcell (B2) adjacent to said first solar subcell (A2) and composed of a semiconductor material having a second band gap smaller than the first band gap and being lattice matched with the upper first solar subcell (A2);
a third solar subcell (C2) adjacent to said second solar subcell (B2) and composed of a semiconductor material having a third band gap smaller than the second band gap and being lattice matched with the second solar subcell (B2) and having a bottom contact;

an interlayer adjacent to said third solar subcell (C2), said interlayer having a fourth band gap greater than said third band gap; and a fourth solar subcell (D2) adjacent to said interlayer and composed of a semiconductor material having a fifth band gap smaller than the fourth band gap and being lattice mismatched with the third solar subcell (C2), and including a first contact on the top surface thereof, and a second contact on the bottom surface thereof connected to the terminal of a second polarity;

(c) wherein the top contact of the first semiconductor body is electrically coupled with the top contact of the second semiconductor body and to a terminal of first polarity;

wherein the first contact on the top surface of the fourth solar subcell (D1) of the first semiconductor body is electrically coupled with the bottom contact of the third solar subcell (C2) of the second semiconductor body;

the second contact on the bottom surface of the fourth solar subcell (D1) of the first semiconductor body is electrically coupled with the first contact on the top surface of the fourth solar subcell (D2) of the second semiconductor body thereof so as to form a five junction solar cell;

and wherein the interlayer in each of the first and second semiconductor bodies is compositionally graded to substantially lattice match the third solar subcell (C1, C2) on one side and the lower fourth solar subcell (D1, D2) on the other side, and is composed of any of the As, P, N, Sb based III-V compound semiconductors subject to the constraints of having the in-plane lattice parameter less than or equal to that of the third solar subcell (C1, C2) and greater than or equal to that of the lower fourth solar subcell (D1, D2).

2. A multijunction solar cell as defined in claim 1, wherein the short circuit density of each fourth subcell (D1, D2) being at least twice that of the solar subcells in each semiconductor body which are connected in a series with the fourth subcell (D1, D2).

3. A multijunction solar cell as defined in claim 1, wherein the fourth subcell (D1, D2) has a band gap of approximately 0.67 eV, the third subcell (C1, C2) has a band gap in the range of approximately 1.41 eV and 1.31 eV, the second subcell (B1, B2) has a band gap in the range of approximately 1.65 to 1.8 eV and the upper first subcell (A1, A2) has a band gap in the range of 2.0 to 2.20 eV.

4. A multijunction solar cell as defined in claim 1, wherein the upper first subcell (A1, A2) is composed of indium gallium aluminum phosphide;

the second solar subcell (B1, B2) includes an emitter layer composed of indium gallium phosphide or aluminum gallium arsenide or indium aluminum gallium arsenide, and a base layer composed of aluminum gallium arsenide, indium gallium arsenide phosphide or indium aluminum gallium arsenide;

the third solar subcell (C1, C2) is composed of indium gallium arsenide;

the fourth subcell (D1, D2) is composed of germanium.

5. A multijunction solar cell as defined in claim 1, wherein the interlayer is composed of p type (Al)In$_x$Ga$_{1-x}$As or In$_x$Ga$_{1-x}$P with 0<x<1, and (Al) designates that aluminum is an optional constituent.

6. A multijunction solar cell as defined in claim 1, wherein the first and second semiconductor bodies further comprise a first highly doped lateral conduction layer disposed adjacent to and above the fourth solar subcell (D1) and a blocking p-n diode or insulating layer disposed adjacent to and above the first highly doped lateral conduction layer, and a second highly doped lateral conduction layer disposed adjacent to and above the blocking p-n diode or insulating layer.

7. A multijunction solar cell assembly as defined in claim 3, wherein the third subcell (C1, C2) has a band gap of approximately 1.37 eV, the second subcell (B1, B2) has a band gap of approximately 1.73 eV and the upper first subcell (A1, A2) has a band gap of approximately 2.10 eV.

8. A multijunction solar cell assembly as defined in claim 1, wherein the band gap of the interlayer is in the range of 1.41 eV to 1.6 eV throughout its thickness.

9. A multijunction solar cell assembly as defined in claim 1, further comprising:

a distributed Bragg reflector layer adjacent to and between the third (C1, C2) and the fourth (D1, D2) solar subcells and arranged so that light can enter and pass through the third solar subcell (C1, C2) and at least a portion of which can be reflected back into the third solar subcell (C1, C2) by the distributed Bragg reflector layer, and the distributed Bragg reflector layer is composed of a plurality of alternating layers of lattice matched materials with discontinuities in their respective indices of refraction and the difference in refractive indices between alternating layers is maximized in order to minimize the number of periods required to achieve a given reflectivity, and the thickness and refractive index of each period determines the stop band and its limiting wavelength, and wherein the distributed Bragg reflector layer includes a first distributed Bragg reflector layer composed of a plurality of p type Al$_x$Ga$_{1-x}$(In)As layers, and a second distributed Bragg reflector layer disposed over the first distributed Bragg reflector layer and composed of a plurality of n type or p type Al$_y$Ga$_{1-y}$(In)As layers, where 0<x<1, 0<y<1, and y is greater than x, and (In) designates that indium is an optional constituent.

10. A multijunction solar cell assembly as defined in claim 2, wherein the short circuit current density ($J^{sc}$) of the first (A1, A2), second (B1, B2) and third middle (C1, C2) subcells are approximately 11 mA/cm$^2$, and the short circuit current density ($J_{sc}$) of the bottom subcell (D1, D2) is approximately 34 mA/cm$^2$.

11. A multijunction solar cell assembly as defined in claim 1, wherein at least the base of at least one of the first (A1, A2), second (B1, B2) or third (C1, C2) solar subcells has a graded doping.

12. A multijunction solar cell assembly as defined in claim 6 comprising:

a first opening in the first semiconductor body extending from a top surface of the semiconductor body to the first lateral conduction layer;

a second opening in the first semiconductor body extending from the top surface of the semiconductor body to the second lateral conduction layer; and a third opening in the first semiconductor body extending from a surface of the first semiconductor body to the p-type semiconductor material of the bottom subcell (D1), a first metallic contact pad disposed on the first lateral conduction layer of each of the first and second semiconductor bodies;

a second metallic contact pad disposed on the second lateral conduction layer of the first semiconductor body; and an electrical interconnect connecting the first and second contact pads, a third metallic contact pad disposed on the second lateral conduction layer of the second semiconductor body;

a fourth metallic contact pad disposed on the p-type semiconductor material of the bottom subcell (D1) of the first semiconductor body; and an electrical interconnect connecting the third and fourth contact pads.

13. A multijunction solar cell assembly having a terminal of a first polarity and a terminal of a second polarity comprising:

(a) a first semiconductor body including:
an upper first solar subcell (A1) composed of a semiconductor material having a first band gap, and including a top contact on the top surface thereof;
a second solar subcell (B1) adjacent to said first solar subcell (A1) and composed of a semiconductor material having a second band gap smaller than the first band gap and being lattice matched with the upper first solar subcell (A1);
a third solar subcell (C1) adjacent to said second solar subcell (B1) and composed of a semiconductor material having a third band gap smaller than the second band gap and being lattice matched with the second solar subcell (B1);
a fourth solar subcell (D1) adjacent to said interlayer and composed of a semiconductor material having a fifth band gap smaller than the fourth band gap, and including a first contact on the top surface thereof, and a second contact on the bottom surface thereof;

(b) a second semiconductor body disposed adjacent and parallel to the first semiconductor body and including:
an upper first solar subcell (A2) composed of a semiconductor material having a first band gap, and including a top contact on the top surface thereof;
a second solar subcell (B2) adjacent to said first solar subcell (A2) and composed of a semiconductor material having a second band gap smaller than the first band gap and being lattice matched with the upper first solar subcell (A2);
a third solar subcell (C2) adjacent to said second solar subcell (B2) and composed of a semiconductor material having a third band gap smaller than the second band gap and being lattice matched with the second solar subcell (B2) and having a bottom contact;
a fourth solar subcell (D2) adjacent to said interlayer and composed of a semiconductor material having a fifth band gap smaller than the fourth band gap, and including a first contact on the top surface thereof, and a second contact on the bottom surface thereof connected to the terminal of a second polarity;

(c) wherein the top contact of the first semiconductor body is electrically coupled with the top contact of the second semiconductor body and to a terminal of first polarity;
wherein the first contact on the top surface of the fourth solar subcell (D1) of the first semiconductor body is electrically coupled with the bottom contact of the third solar subcell (C2) of the second semiconductor body;
the second contact on the bottom surface of the fourth solar subcell (D1) of the first semiconductor body is electrically coupled with the first contact on the top surface of the fourth solar subcell (D2) of the second semiconductor body thereof so as to form a five junction solar cell;
wherein the first and second semiconductor bodies further comprise a first highly doped lateral conduction layer disposed adjacent to and above the fourth solar subcell (D1) and a blocking p-n diode or insulating layer disposed adjacent to and above the first highly doped lateral conduction layer, and a second highly doped lateral conduction layer disposed adjacent to and above the blocking p-n diode or insulating layer.

14. A multijunction solar cell as defined in claim 1, wherein the fourth subcell (D1, D2) has a band gap of approximately 0.67 eV, the third subcell (C1, C2) has a band gap in the range of approximately 1.41 eV and 1.31 eV, the second subcell (B1, B2) has a band gap in the range of approximately 1.65 to 1.8 eV and the upper first subcell (A1, A2) has a band gap in the range of 2.0 to 2.20 eV.

15. A multijunction solar cell as defined in claim 13, wherein the upper first subcell (A1, A2) is composed of indium gallium aluminum phosphide;
the second solar subcell (B1, B2) includes an emitter layer composed of indium gallium phosphide or aluminum gallium arsenide or indium aluminum gallium arsenide, and a base layer composed of aluminum gallium arsenide, indium gallium arsenide phosphide or indium aluminum gallium arsenide;
the third solar subcell (C1, C2) is composed of indium gallium arsenide; and
the fourth subcell (D1, D2) is composed of germanium.

16. A multijunction solar cell assembly as defined in claim 13, further comprising:
a distributed Bragg reflector layer adjacent to and between the third (C1, C2) and the fourth (D1, D2) solar subcells are arranged so that light can enter and pass through the third solar subcell (C1, C2) and at least a portion of which can be reflected back into the third solar subcell (C1, C2) by the distributed Bragg reflector layer, and the distributed Bragg reflector layer is composed of a plurality of alternating layers of lattice matched materials with discontinuities in their respective indices of refraction and the difference in refractive indices between alternating layers is maximized in order to minimize the number of periods required to achieve a given reflectivity, and the thickness and refractive index of each period determines the stop band and its limiting wavelength, and wherein the distributed Bragg reflector layer includes a first distributed Bragg reflector layer disposed over the first distributed Bragg reflector layer and composed of a plurality of n type or p type $Al_yGa_{1-y}(In)As$ layers, where $0<x<1$, $0<y<1$, and y is greater than x, and (In) designates that indium is an optional constituent.

17. A multijunction solar cell assembly as defined in claim 13, wherein the short circuit current density ($J_{sc}$) of the first (A1, A2), second (B1, B2) and third middle (C1, C2) subcells are approximately 11 mA/cm$^2$, and the short circuit current density ($J_{sc}$) of the bottom subcell (D1, D2) is approximately 34 mA/cm$^2$.

18. A multijunction solar cell assembly as defined in claim 13, wherein at least the base of at least one of the first (A1, A2), second (B1, B2) or third (C1, C2) solar subcells has a graded doping.

19. A multijunction solar cell assembly as defined in claim 13, comprising:
- a first opening in the first semiconductor body extending from a top surface of the semiconductor body to the first lateral conduction layer;
- a second opening in the first semiconductor body extending from the top surface of the semiconductor body to the second lateral conduction layer;
- a second opening in the first semiconductor body extending from the top surface of the semiconductor body to the second lateral conduction layer; and
- a third opening in the first semiconductor body extending from a surface of the first semiconductor body to the p-type semiconductor material of the bottom subcell ($D_1$), a first metallic contact pad disposed on the first lateral conduction layer of each of the first and second semiconductor bodies;
- a second metallic contact pad disposed on the second lateral conduction layer of the first semiconductor body; and
- an electrical interconnect connecting the first and second contact pads, a third metallic contact pad disposed on the second lateral conduction layer of the second semiconductor body;
- a fourth metallic contact pad disposed on the p-type semiconductor material of the bottom subcell (D1) of the first semiconductor body; and
- an electrical interconnect connecting the third and fourth contact pads.

* * * * *